(12) United States Patent
Kawaguchi et al.

(10) Patent No.: US 6,826,104 B2
(45) Date of Patent: Nov. 30, 2004

(54) SYNCHRONOUS SEMICONDUCTOR MEMORY

(75) Inventors: Kazuaki Kawaguchi, Kawasaki (JP); Shigeo Ohshima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 10/227,779

(22) Filed: Aug. 26, 2002

(65) Prior Publication Data

US 2003/0035335 A1 Feb. 20, 2003

Related U.S. Application Data

(63) Continuation-in-part of application No. 09/816,616, filed on Mar. 23, 2001, now abandoned.

(30) Foreign Application Priority Data

Mar. 24, 2000 (JP) ........................................ 2000-085107

(51) Int. Cl.$^7$ ............................................... G11C 7/00
(52) U.S. Cl. .................... 365/222; 365/230.09; 365/236
(58) Field of Search ............................ 365/222, 230.09, 365/236

(56) References Cited

U.S. PATENT DOCUMENTS

| | | | | |
|---|---|---|---|---|
| 3,748,651 A | * | 7/1973 | Mesnik ........................ | 365/222 |
| 4,747,082 A | * | 5/1988 | Minato et al. ............... | 365/222 |
| 6,088,291 A | | 7/2000 | Fujioka et al. | |
| 6,144,617 A | | 11/2000 | Takai ....................... | 365/230.08 |
| 6,222,785 B1 | | 4/2001 | Leung ......................... | 365/222 |
| 6,317,852 B1 | | 11/2001 | Lau et al. ................... | 365/201 |
| 6,426,915 B2 | | 7/2002 | Ohshima et al. | |

FOREIGN PATENT DOCUMENTS

JP     WO 98-56004     12/1998

OTHER PUBLICATIONS

Yasuharu Sato et al., "Fast Cycle RAM (FCRAM); a 20–ns Random Row Access, Pipe–Lined Operating DRAM", (VLSI Symp. 1998).

* cited by examiner

*Primary Examiner*—Hoai Ho
(74) *Attorney, Agent, or Firm*—Hogan & Hartson, LLP

(57) ABSTRACT

In an FCRAM having a late write function, when a first command signal indicates "write active", whether a write operation or an auto-refresh operation is to be performed is determined on the basis of a second command signal. For example, when the second command signal indicates "write", a write operation for a memory cell is performed by a late write scheme. When the second command signal indicates "auto-refresh", an auto-refresh operation is performed. In the last write cycle of a write operation immediately preceding this auto-refresh operation, addresses for selecting a memory cell as an object of auto-refresh are predetermined. After data write to a memory cell is completed in the last write cycle, row precharge for auto-refresh is performed. After that, an auto-refresh operation (i.e., a data read operation and a data restore operation) is performed for the selected memory cell.

18 Claims, 20 Drawing Sheets

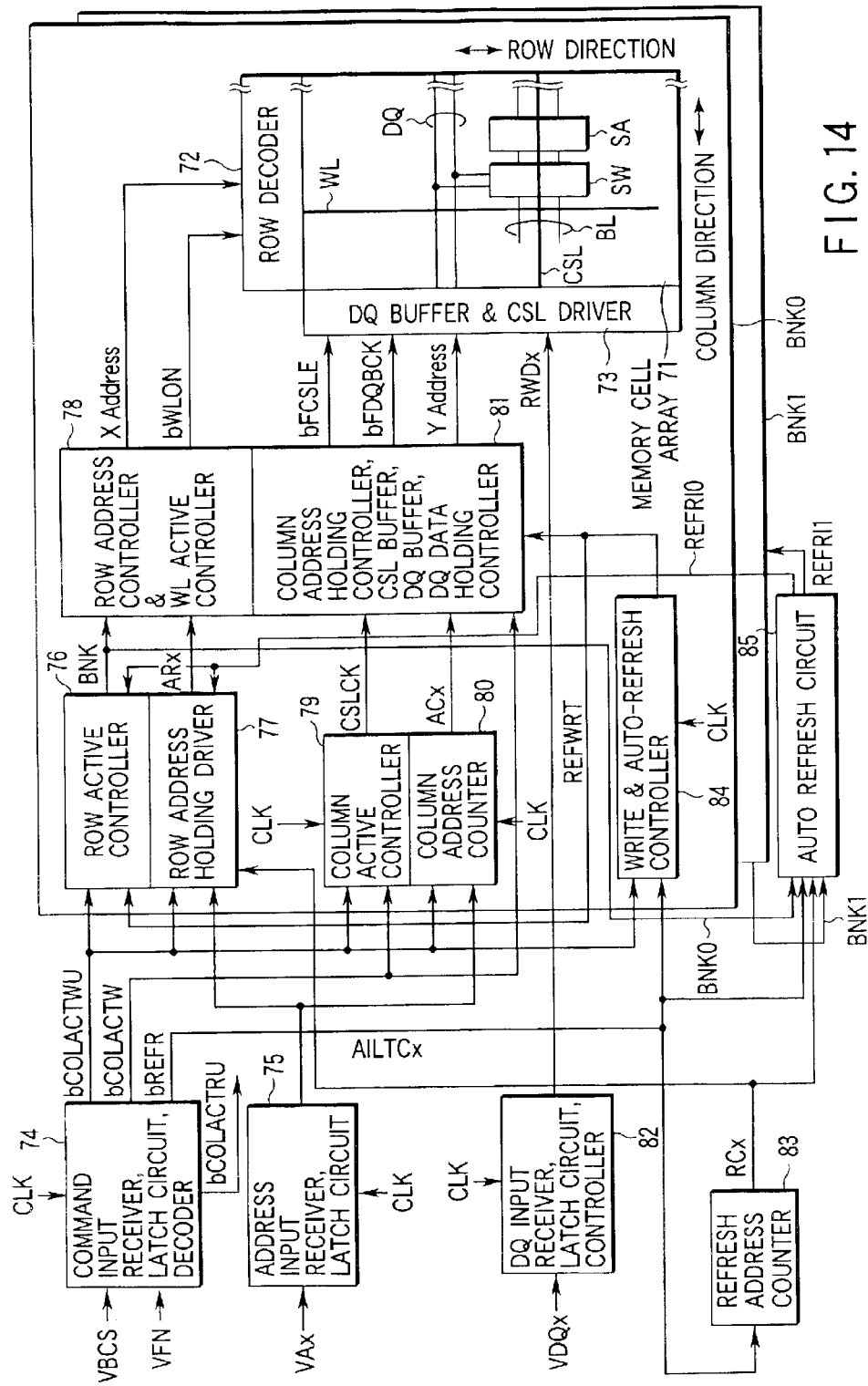
F I G. 14

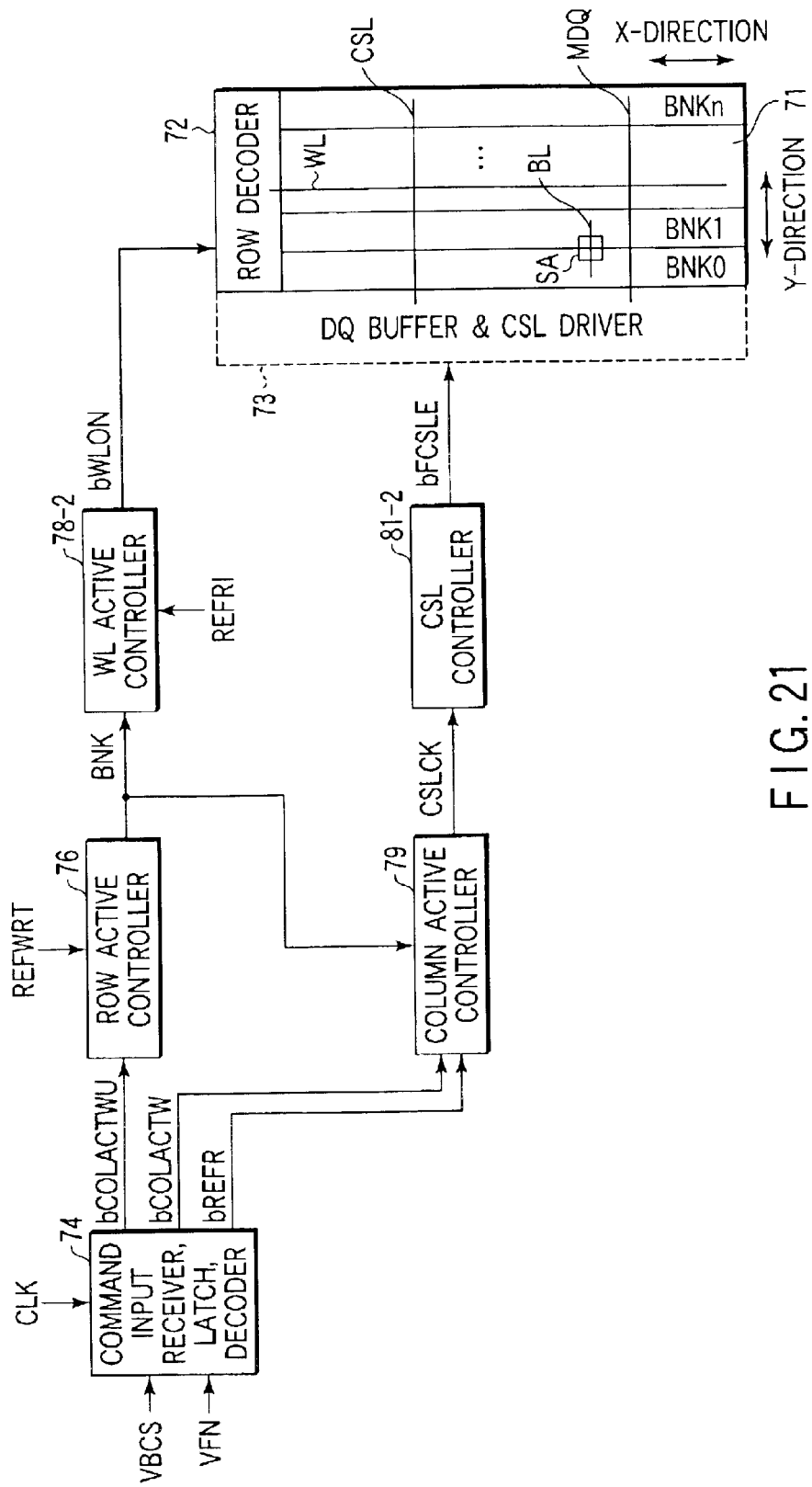
F I G. 21

SYNCHRONOUS SEMICONDUCTOR MEMORY

CROSS-REFERENCE TO RELATED APPLICATIONS

This is a Continuation-in-Part application of U.S. patent application Ser. No. 09/816/616, filed Mar. 23, 2001, now abandoned, the entire contents of which are incorporated herein by reference.

This application is based upon and claims the benefit of priority from the prior Japanese Patent Application No. 2000-085107, filed Mar. 24, 2000, the entire contents of which are incorporated herein by reference.

BACKGROUND OF THE INVENTION

1. Field of the Invention

The present invention relates to a synchronous semiconductor memory and, more particularly, to a synchronous dynamic random access memory (SDRAM) having a fast (high speed) random row access function, such as a single data rate type fast cycle random access memory (SDR-FCRAM) or a double data rate type fast cycle random access memory (DDR-FCRAM) having a data rate twice that of the SDR-FCRAM.

2. Description of the Related Art

The SDRAM can realize fast random row access close to that of a static random access memory (SRAM). Hence, this SDRAM is recently extensively used as a memory having both large memory capacity and fast random row access, as the characteristic features of a DRAM.

This fast random row access of the SDRAM is accomplished by performing a random access operation (data read operation or data write operation) in synchronism with an external clock (fast clock) having a high frequency, thereby improving the data band width (=the number of data bytes per unit time).

The SDRAM has been put into practical use since the memory capacity was 4 or 16 Mbits, and most DRAMs having a memory capacity of 64 Mbits are SDRAMs. Recently, a DDR-SDRAM (double data rate type SDRAM) having a data rate twice that of the SDRAM (single data rate type SDRAM) is put into practical use to further increase the speed of the fast random row access of the DRAM.

As described above, the characteristic feature of the SDRAM is to increase the data rate, i.e., improve the data band width, by reducing the substantial access time and cycle time. However, this feature is limited when random access is performed for an internal memory cell array of a memory core, i.e., when the row address changes.

More specifically, when the row address changes, operations unique to the DRAM such as precharge performed prior to data read and data restore caused by so-called data destructive read must be performed whenever the row address changes. The time required for such an operation is called core latency, and this core latency suppresses improvements of cycle time (=random cycle time) tRC when the row address changes.

A technique for solving this problem is proposed in, e.g., reference 1: "a 20 ns Random Access Pipelined Operating DRAM" (VLSI Symp. 1998). This reference 1 disclosed a Fast Cycle RAM (to be referred to as an FCRAM hereinafter) in which random access and precharge for a memory cell array in a memory core are pipelined, in order to improve the random cycle time tRC when the row address changes.

The basic system of this FCRAM is proposed in, e.g., reference 2: International Patent Application (International Publication No.) WO98/56004 declaring priority based on Japanese Patent Application Nos. 9-145406, 9-215047, and 9-332739. This reference 2 discloses the basic system of the FCRAM, which improves the random cycle time tRC by using a pipeline operation when accessing different rows.

The FCRAM using this pipeline operation is expected to be applied to the field of networks required to transfer huge amounts of random data at high speed. In particular, SRAMs (Static RAMs) conventionally constructing a LAN switch/router system as the gate of a WAN (Wide Area Network) are recently beginning to be replaced with FCRAMs having high memory capacity and capable of fast random row access.

BRIEF SUMMARY OF THE INVENTION

It is an object of the present invention to eliminate unnecessary row access from the second cycle of successive auto-refresh cycles, when a "Late Write" type data write system is applied to an FCRAM, thereby preventing operation errors of the FCRAM during auto-refresh, reducing the current consumption of the FCRAM during auto-refresh, improving the reliability of a memory cell of the FCRAM, and increasing the margin of refresh cycle time tREFC of the FCRAM.

A synchronous semiconductor memory of the present invention has a memory cell array including a plurality of memory cells arranged in a matrix manner. In read operation, information is read out from a memory cell in accordance with a read command of a plurality of commands input in synchronism with an external clock. In write operation, data is written in a memory cell in accordance with a write command of a plurality of commands input in synchronism with the external clock. First and second commands are input in order in synchronism with the external clock. On the basis of the first command, one of read active and write active is determined. On the basis of the second command, one of a write mode and an auto-refresh mode is selected. When the write mode is selected by the second command, data write to the memory cell array is executed. When the auto-refresh mode is selected by the second command, an auto-refresh operation is executed for the memory cell array. In an auto-refresh cycle, an auto-refresh circuit executes a write operation by using row and column addresses loaded in an immediately preceding write cycle of this auto-refresh cycle. When this write operation is completed, row precharge is performed. After this row precharge, the auto-refresh operation is started. A write & auto-refresh controller performs control such that no column access operation is performed in the second and subsequent cycles of a plurality of successive auto-refresh cycles, and that write of write data is inhibited.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 14 is a view showing the second embodiment of the synchronous semiconductor memory of the present invention;

FIG. 21 is a block diagram showing an example of a row/column control system according to the invention.

DETAILED DESCRIPTION OF THE INVENTION

A synchronous semiconductor memory of the present invention will be described below with reference to the accompanying drawings.

(1) Command Scheme of FCRAM

First, the command scheme of an FCRAM will be described below by taking a Delayed Write type (Late Write type) FCRAM as an example.

Figure 1:
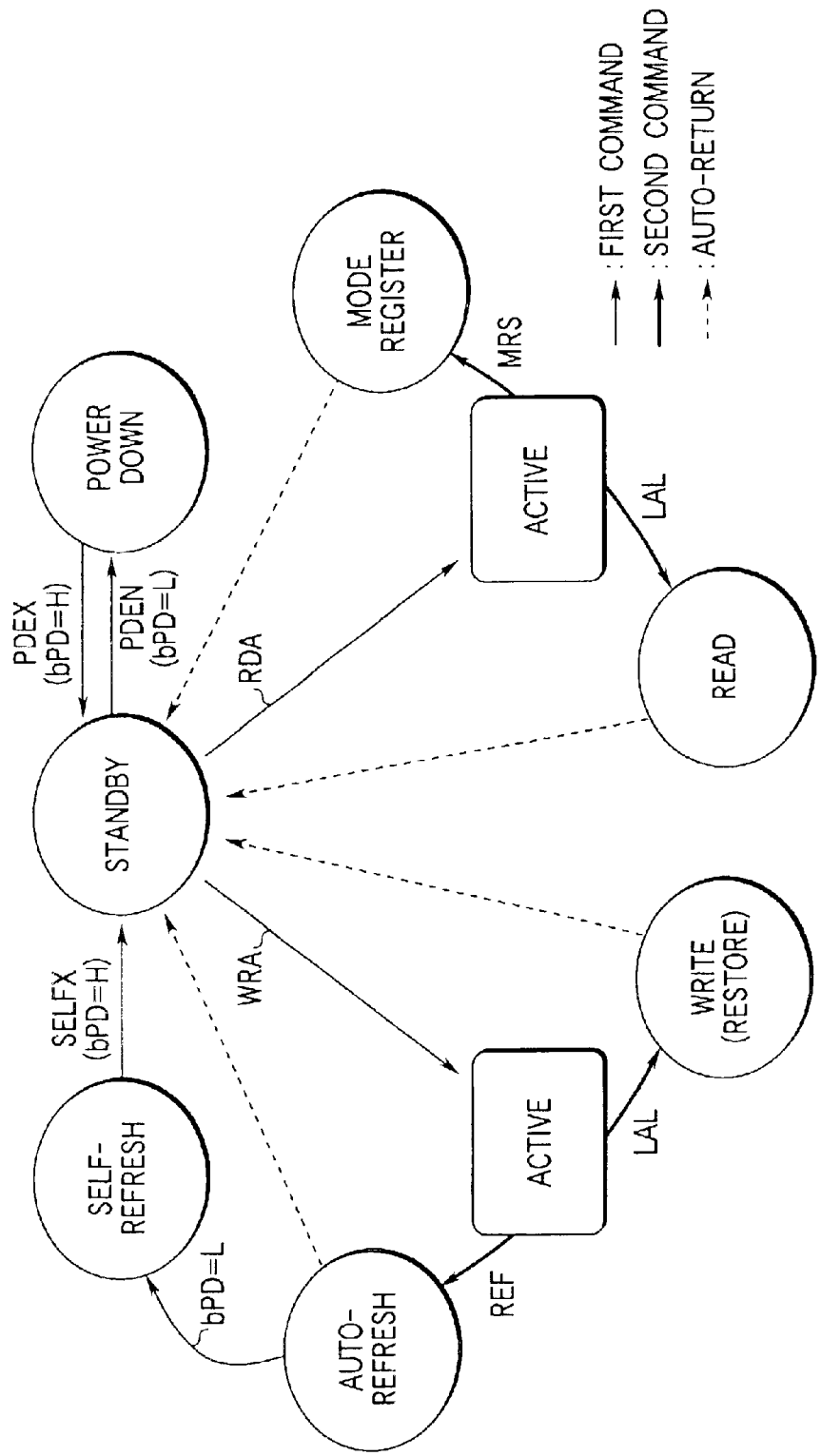
FIG. 1 is a view showing the way an operation mode is determined by combining first and second commands.

FIG. 1 shows the command scheme of this FCRAM.

Referring to FIG. 1, circles indicate operation modes, and squares indicate the states (active states) immediately before these operation modes are determined. Thin arrows indicate first commands, and thick arrows indicate second commands. Broken arrows indicate the way the operation automatically returns to a standby mode after the operation mode determined by the first and second commands is completed.

A command PDEX (bPD="H") changes a power down state to a standby state, and a command PDEN (bPD="L") changes the standby state to the power down state. First commands WRA (WRite with Auto-close) and RDA (ReaD with Auto-close) set the active state immediately before an operation mode is determined.

When a second command is input into the chip after that, an operation mode is determined. For example, if "LAL (Lower Address Latch)" is input as the second command into the chip when the first command is "WRA", a write mode (including write for data restore) is executed. When this write mode is completed, auto-return to the standby mode is performed.

If "REF (auto REFresh)" is input as the second command into the chip when the first command is "WRA", an auto-refresh mode is executed. When this auto-refresh mode is completed, auto-return to the standby mode is performed.

If "LAL" is input as the second command into the chip when the first command is "RDA", a read mode is executed. When this read mode is completed, auto-return to the standby mode is performed. If "MRS (Mode Register Set)" is input as the second command into the chip when the first command is "RDA", a mode register is set. When this mode register setting is completed, auto-return to the standby mode is performed.

As described above, the operation mode of the FCRAM is determined by the combination of the first and second commands.

Tables 1 and 2 show the relationships between commands (symbols and functions) and data input into the package from external terminals (pin names) of the package.

TABLE 1

| | | | PIN NAME | | | | |
| --- | --- | --- | --- | --- | --- | --- | --- |
| | | | | FN | A14 | A13 | | |
| FUNCTION | SYMBOL | bCS | (bRAS) | (bWE) | (bCAS) | BA1-0 | A12-0 |
| DESELECT | DESL | H | X | X | X | X | X |
| READ WITH AUTO-CLOSE | RDA | L | H | UA | UA | BA | UA |
| WRITE WITH AUTO-CLOSE | WRA | L | L | UA | UA | BA | UA |

TABLE 2

| | | | PIN NAME | | | | |
|---|---|---|---|---|---|---|---|
| FUNCTION | SYMBOL | bCS | FN (bRAS) | A14 (bWE) | A13 (bCAS) | BA1-0 | A12-0 |
| LOWER ADDRESS LATCH | LAL | H | X | V | V | V | LA |
| MODE REGISTER SET | MRS | L | X | L | L | L | V |
| AUTO-REFRESH | REF | L | X | X | X | X | X |

To input commands for controlling the operation of the FCRAM into the chip, two terminals, i.e., a chip select terminal bCS and a row address strobe terminal FN (bRAS), of a plurality of external terminals Pin of the package are used. Types of commands which can be input into the chip at one time (in one cycle) by using these two terminals are limited. That is, it is difficult to determine many modes by only one command input cycle.

Accordingly, operation modes are determined by the combinations of a plurality of commands input into the chip in a plurality of command input cycles. That is, as shown in FIG. 1, first and second commands are input in two command input cycles, and an operation mode is determined by the combination of these first and second commands.

Table 1 shows how the first commands RDA and WRA in FIG. 1 are represented by the two external terminals bCS and FN.

The read with auto-close command RDA is represented by bCS="L (Low)" and FN="H (High)". The write with auto-close command WRA is represented by bCS="L" and FN="L".

Table 2 shows how the second commands LAL, MRS, and REF in FIG. 1 are represented by the two external terminals bCS and FN.

The lower address latch LAL is represented by bCS="H", and the mode register set MRS and the auto-refresh REF are represented by bCS="L".

In Tables 1 and 2, US denotes upper address; BA, bank address; LA, lower address; V, varied data (determined by UA and BA in Table 1); and X, don't care.

In this example, a control signal for controlling active/inactive of a sense amplifier can be input into the chip simultaneously with a first command. For example, as shown in Table 1, two external terminals, i.e., a write enable terminal bWE and a column address strobe terminal bCAS, of the FCRAM (package) are used as address pins A14 and A13, respectively, for selecting a sense amplifier.

Figure 2:
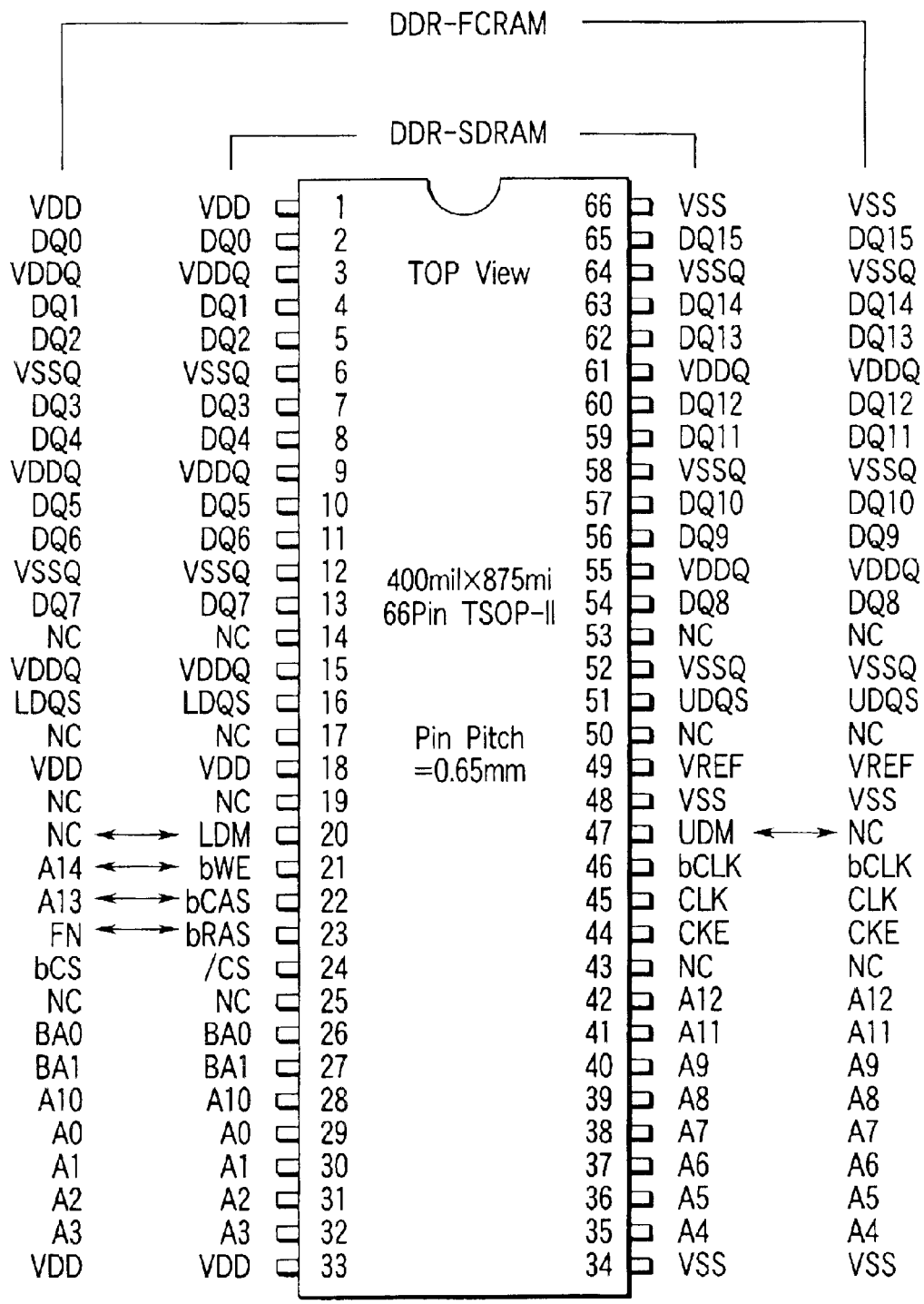
FIG. 2 is a view showing the functions of pins of an FCRAM package.

FIG. 2 compares the pin arrangements of packages of a DDR-SDRAM and a DDR-FCRAM.

In this example, the terminals bWE and bCAS of the DDR-SDRAM are used as the address terminals A14 and A13, respectively, of the DDR-FCRAM. This package is a 66-pin TSOP package standardized by JEDEC. The upper address UA is input into the chip simultaneously with a first command by using the address terminals A14 and A13. The lower address LA is input into the chip simultaneously with a second command by using address terminals A12 to A0.

More specifically, at the leading edge of an external clock, a first command is loaded into the chip, and at the same time the upper address UA is loaded into the chip by using the terminals bWE and bCAS. If the first command is "RDA", a row (word line) is selected on the basis of the upper address UA. Memory cell data output to a bit line is sensed and amplified by a sense amplifier.

After that, at the next leading edge of the external clock, a second command is loaded into the chip, and at the same time the lower address LA is loaded into the chip by using the terminals A12 to A0. If the second command is "LAL", a column (bit line) is selected on the basis of the lower address LA.

In the above practical example, the read mode is selected by the first and second commands. The low address is loaded into the chip in the first cycle of the external clock, and the column address is loaded into the chip in the second cycle. In the second cycle, ON/OFF of a column-select switch is controlled on the basis of the column address. Data of a sense amplifier in the selected column is output outside the chip via a data line pair, read buffer, and output terminal.

Command decoders which achieve the above operation will be described below.

Figure 3:
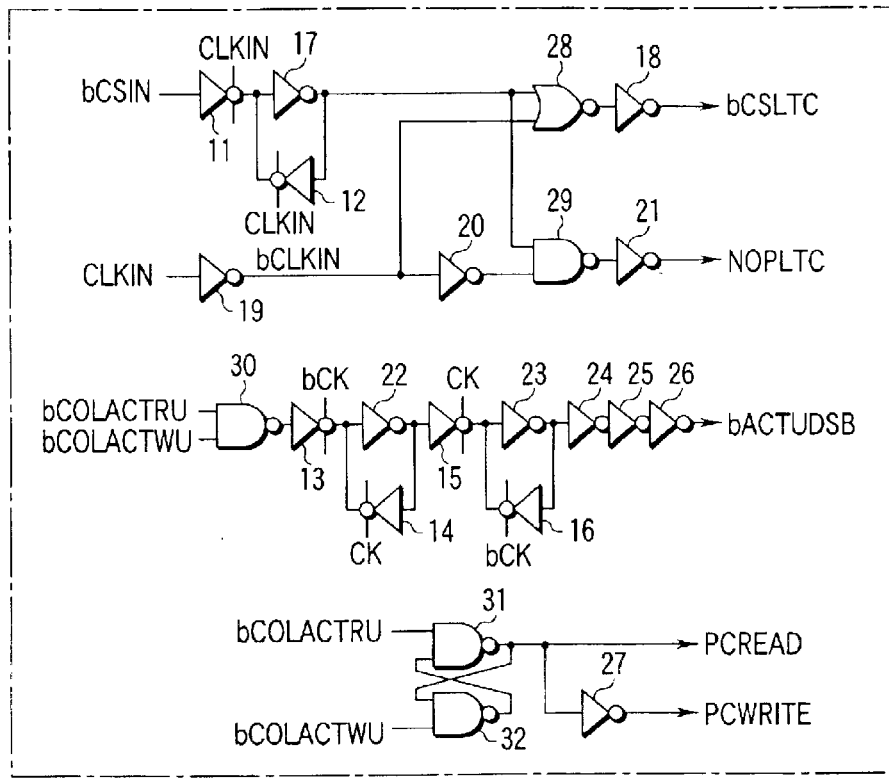
FIG. 3 is a view showing a controller for controlling command decoders.
Figure 4:
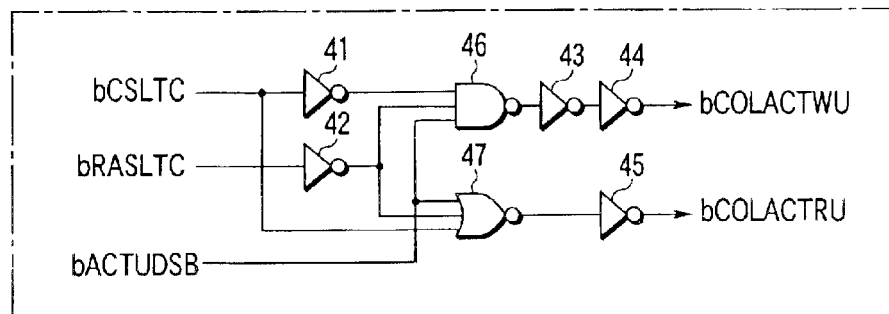
FIG. 4 is a view showing a command decoder on the upper address side.
Figure 5:
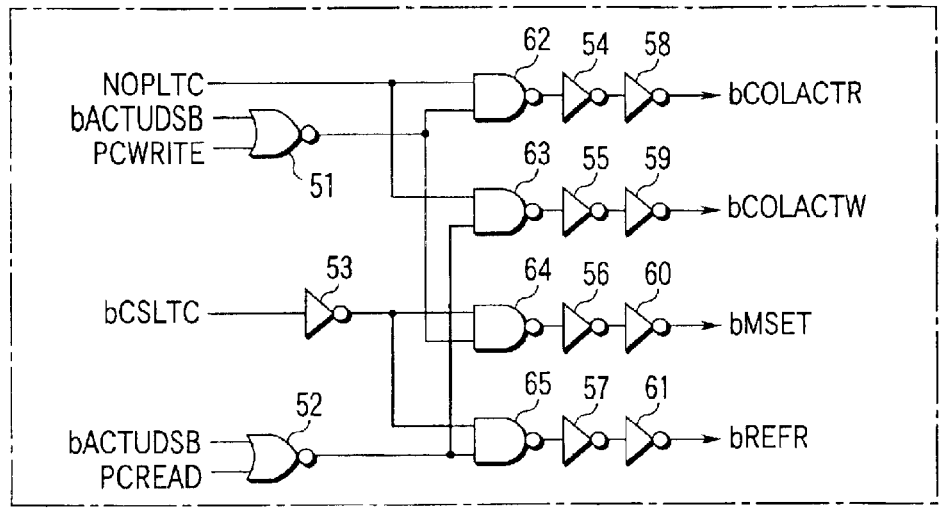
FIG. 5 is a view showing a command decoder on the lower address side.

FIG. 3 shows a practical example of a controller for controlling the operations of command decoders. FIG. 4 shows a command decoder on the upper address side. FIG. 5 shows a command decoder on the lower address side.

First, the controller shown in FIG. 3 will be explained. This controller comprises clocked inverters 11 to 16, inverters 17 to 27, a NOR gate 28, and NAND gates 29 to 32.

The active/inactive states of the clocked inverters 11 and 12 are controlled by output signals from a clock buffer with respect to an external clock. An input signal bCSIN is input to the clocked inverter 11. This bCSIN is an output signal from a buffer which receives an input signal from the external terminal bCS.

The output terminal of the clocked inverter 11 is connected to the input terminals of the NOR gate 28 and the NAND gate 29 via a latch circuit including the inverters 12 and 17. The output terminal of the NOR gate 28 is connected to the input terminal of the inverter 18. The output terminal of the NAND gate 29 is connected to the input terminal of the inverter 21. An output signal bCSLTC is output from the inverter 18, and an output signal NOPLTC is output from the inverter 21.

A clock CLKIN is input to the inverter 19. An output clock bCLKIN from the inverter 19 is input to the NOR gate 28. A clock bCLKIN is input to the NAND gate 29 via the inverter 20.

Input signals bCOLACTRU and bCOLACTWU are input to the NAND gate 30. The input signal bCOLACTRU indicates that the command "RDA" is input into the chip. The input signal bCOLACTWU indicates that the command "WRA" is input into the chip.

The output terminal of the NAND gate 30 is connected to a latch circuit including the inverters 14 and 22, via the clocked inverter 13. This clocked inverter 13 is controlled by a signal bCK obtained by inverting an output signal CK from a clock buffer which receives an external clock. The clocked inverter 14 is controlled by the output signal CK from the clock buffer for receiving an external clock.

The output terminal of the inverter 22 is connected to a latch circuit including the inverters 16 and 23, via the clocked inverter 15. This clocked inverter 15 is controlled by the output signal CK from the clock buffer for receiving an external clock. The clocked inverter 16 is controlled by the signal bCK obtained by inverting the output signal CK from the clock buffer which receives an external clock.

The output terminal of the inverter 23 is connected to the inverters 24, 25, and 26 connected in series. An output signal bACTUDSB is output from the inverter 26.

The NAND gates 31 and 32 are connected to form a flip-flop circuit. The output terminal of the NAND gate 31 is connected to the input terminal of the inverter 27. The input signal bCOLACTRU is input to the NAND gate 31, and the input signal bCOLACTWU is input to the NAND gate 32. An output signal PCREAD is output from the NAND gate 31. An output signal PCWRITE is output from the inverter 27.

The command decoder on the upper address side shown in FIG. 4 will be described below. This command decoder comprises inverters 41 to 45, a NAND gate 46, and a NOR gate 47.

The signal bCSLTC is input to the inverter 41 and the NOR gate 47. An output signal from the inverter 41 is input to the NAND gate 46. An input signal bRASLTC is input to the inverter 42. An output signal from this inverter 42 is input to the NAND gate 46 and the NOR gate 47. The signal bACTUDSB is also input to the NAND gate 46 and the NOR gate 47.

The input signal bCSLTC is an output signal from a buffer which receives a signal input from the external terminal A13 (bCAS) into the chip. The input signal bRASLTC is an output signal from a buffer which receives a signal input from the external terminal FN (bRAS) into the chip. The input signal bACTUDSB is supplied from the controller shown in FIG. 3.

The output terminal of the NAND gate 46 is connected to the inverters 43 and 44 connected in series. The output terminal of the NOR gate 47 is connected to the inverter 45. The signal bCOLACTWU is output from the inverter 44, and the signal bCOLACTRU is output from the inverter 45. These output signals bCOLACTWU and bCOLACTRU are supplied to the controller shown in FIG. 3.

The NOR gate 47 is effective to reduce the number of gates and shorten random access time tRAC.

The command decoder on the lower address side shown in FIG. 5 will be described below. This command decoder comprises NOR gates 51 and 52, inverters 53 to 61, and NAND gates 62 to 65.

The signals bACTUDSB and PCWRITE supplied from the controller shown in FIG. 3 are input to the NOR gate 51. Also, the signal NOPLTC from this controller shown in FIG. 3 is input to the NAND gates 62 and 63. An output signal from the NOR gate 51 is input to the NAND gates 62 and 64.

The signal bCSLTC is input to the NAND gates 64 and 65 via the inverter 53.

The signals bACTUDSB and PCREAD supplied from the controller shown in FIG. 3 are input to the NOR gate 52. An output signal from this NOR gate 52 is input to the NAND gates 63 and 65.

The output terminal of the NAND gate 62 is connected to the series-connected inverters 54 and 58. The output terminal of the NAND gate 63 is connected to the series-connected inverters 55 and 59. The output terminal of the NAND gate 64 is connected to the series-connected inverters 56 and 60. The output terminal of the NAND gate 65 is connected to the series-connected inverters 57 and 61.

An output signal bCOLACTR is output from the inverter 58. An output signal bCOLACTW is output from the inverter 59. An output signal bMSET is output from the inverter 60. An output signal bREFR is output from the inverter 61.

The output signal bCOLACTR represents that the read command "RDA" is input in the first cycle, and the command "LAL" is input in the second cycle. The output signal bCOLACTW represents that the write command "WRA" is input in the first cycle, and the command "LAL" is input in the second cycle.

The output signal bMSET represents that the read command "RDA" is input in the first cycle, and the command "MRS" is input in the second cycle. The output signal bREFR represents that the write command "WRA" is input in the first cycle, and the command "REF" is input in the second cycle.

Figure 6:
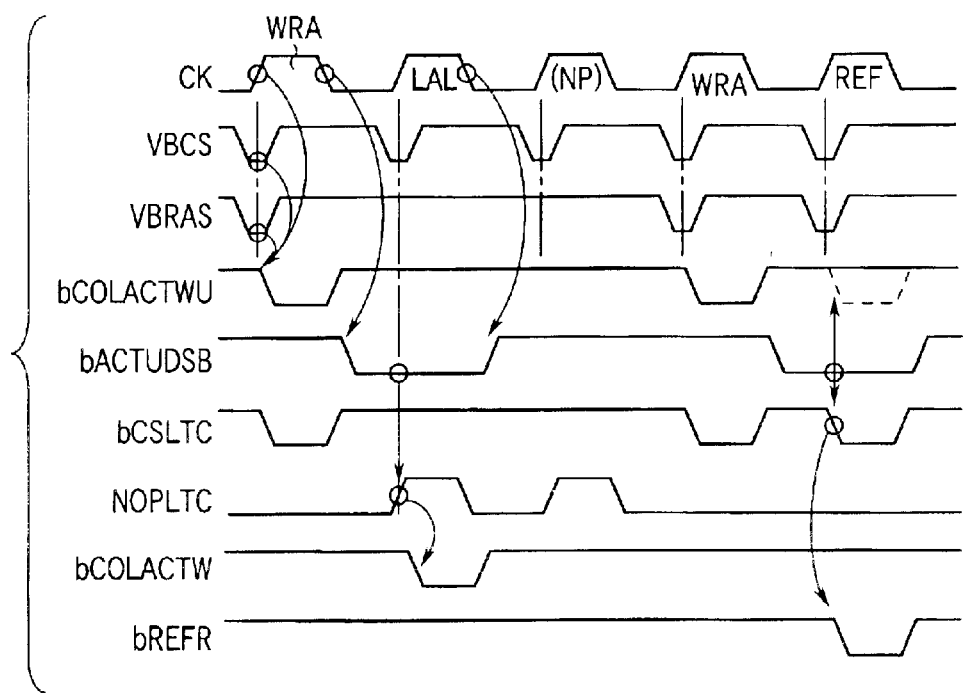
FIG. 6 is a timing chart showing the operations of the command decoders shown in FIGS. 3 to 5.

The operations of the command decoders shown in FIGS. 3 to 5 will be described below with reference to a timing chart in FIG. 6.

First, an operation when a first command is input into the chip in the first cycle will be explained. The levels of the signals bCSLTC and bRASLTC shown in FIG. 4 are determined by the level of an input signal VBCS from the external terminal bCS and the level of an input signal VBRAS from the external terminal FN (bRAS).

For example, if the first command is "WRA", the VBCS is at level "L", and the VBRAS is at level "L", both the signals bCSLTC and bRASLTC are at level "L". Also, since the signal bACTUDSB is at level "H", all input signals to the NAND gate 46 are at level "H", with the result that the signal bCOLACTWU is at level "L".

The level of the signal bACTUDSB changes from "H" to "L" in response to the trailing edge of the clock CK in the first cycle. After that, this signal bACTUDSB maintains level "L" until the trailing edge of the clock CK in the second cycle.

In the second cycle, a second command is input into the chip.

If this second command is "LAL", the VBCS is at level "L", and the VBRAS is at level "H", the signal bCOLACTWU is at level "L". Therefore, the signal NOPLTC changes to level "H". This signal NOPLTC detects whether the signal bCSIN is at level "H" (NOP: No OPeration) on the leading edge of the clock CK.

If the signal NOPLTC changes to level "H", the signal bACTUDSB changes to level "L", and the signal PCWRITE changes to level "H" (the signal PCREAD changes to level "L"), the signal bCOLACTW changes to level "L". Also, if the signal bCOLACTW is at level "L" and the signal PCREAD is at level "H", the signal bCOLACTR changes to level "L" to make it possible to distinguish between the read mode and the write mode.

If the second command is "REF" or "MRS", the signal bCSLTC changes to level "L", and the signal bACTUDSB changes to level "L". The levels of the signals bREFR and bMSET are determined by the levels of the signals FCREAD and FCWRITE. If the levels of the signals bREFR and bMSET are "L", an input signal from the external terminal bCS is "L". Hence, the signal bACTUDSB is set at level "L" so that the first command decoder does not operate.

By the above operation, effects (A) and (B) described below can be achieved.

(A) Since the read/write mode is determined by using the first command, the operation of the memory cell array and its peripheral circuit can be started at the same time the row address is loaded. In this case, therefore, the random access operation can be started earlier and the random access time tRAC can be made shorter by one cycle than when the read/write mode is determined by using the first and second commands.

(B) In the first cycle, the read/write mode is determined by using the first command. Hence, in the second cycle it is only necessary to load the lower address LA into the chip. Since this increases the speed of column selection, it is possible to reduce the random access time tRAC and the random cycle time tRC.

Operations when row access and precharge are pipelined in the above-mentioned Delayed Write type (Late Write type) FCRAM will be described below.

When this is the case, the write mode (including the restore mode) is determined by inputting "WRA" as the first command and "LAL" as the second command. Also, the auto-refresh mode is determined by inputting "WRA" as the first command and "REF" as the second command.

First, a pipeline write operation will be described below.

In a first write cycle, a row address, column address, and write data are loaded into the chip. In a second write cycle following this first write cycle, a memory cell selecting operation (random access operation) is performed on the basis of the row and column addresses loaded in the first write cycle. In this second write cycle, the write data is transferred to a bit line and written in a memory cell selected by the random access operation.

In the pipeline write operation as described above, two clock cycles are necessary to write one write data into a memory cell. However, one write data is written in a memory cell in one clock cycle as a whole.

That is, address and data loading and a random access operation are conventionally performed in one clock cycle. Since this prolongs one clock cycle, it is inevitably impossible to realize high data rate. In this example, however, data is written in a memory cell and at the same time the next addresses and data are loaded into the chip in one clock cycle.

Accordingly, a data write operation for the memory cell need only be performed in the next cycle. In parallel with this operation, addresses and data to be used in the subsequent cycle are loaded. This shortens one clock cycle and achieves high data rate.

Figure 7:
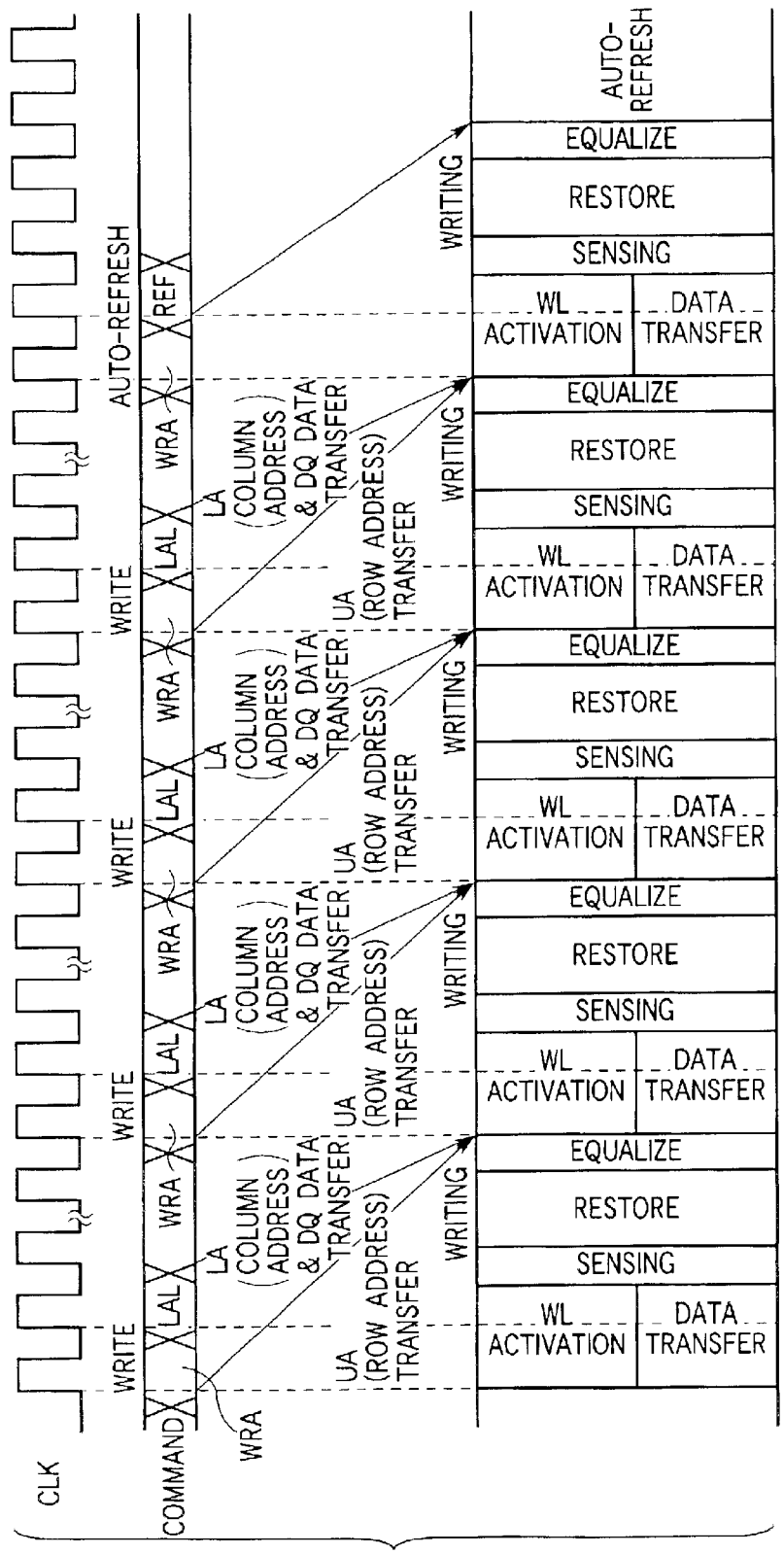
FIG. 7 is a view showing an example of the operation of a Late Write type FCRAM.

FIG. 7 shows an outline of the operation when the auto-refresh mode is performed subsequently to the write mode.

The auto-refresh mode is executed when "WRA" is input as the first command into the chip and "REF" is input as the second command into the chip. In either of the write mode and the auto-refresh mode, "WRA" is input as the first command into the chip. At this point, therefore, the mode cannot be determined. That is, the mode cannot be determined unless the second command is discriminated.

When the write mode is detected, access is performed on the basis of the UA (upper address) and the LA (lower address), and word line activation and data transfer are executed. After that, data sensing and a data restore operation are performed. After data is read out onto a data line, bit line equalization is performed to prepare for the next operation.

When the auto-refresh mode is detected, row access is performed on the basis of only the UA (upper address), and word line activation and data transfer are executed. After data sensing and a data restore operation are performed, bit line equalization is performed to prepare for the next operation.

In performing the write mode, however, the write operation is started after the second command is input into the chip. This prolongs the RAS cycle time tRC and degrades the data rate. Also, in performing the auto-refresh mode, no auto-refresh operation can be executed unless the write operation in the preceding write mode is completed.

Figure 8:
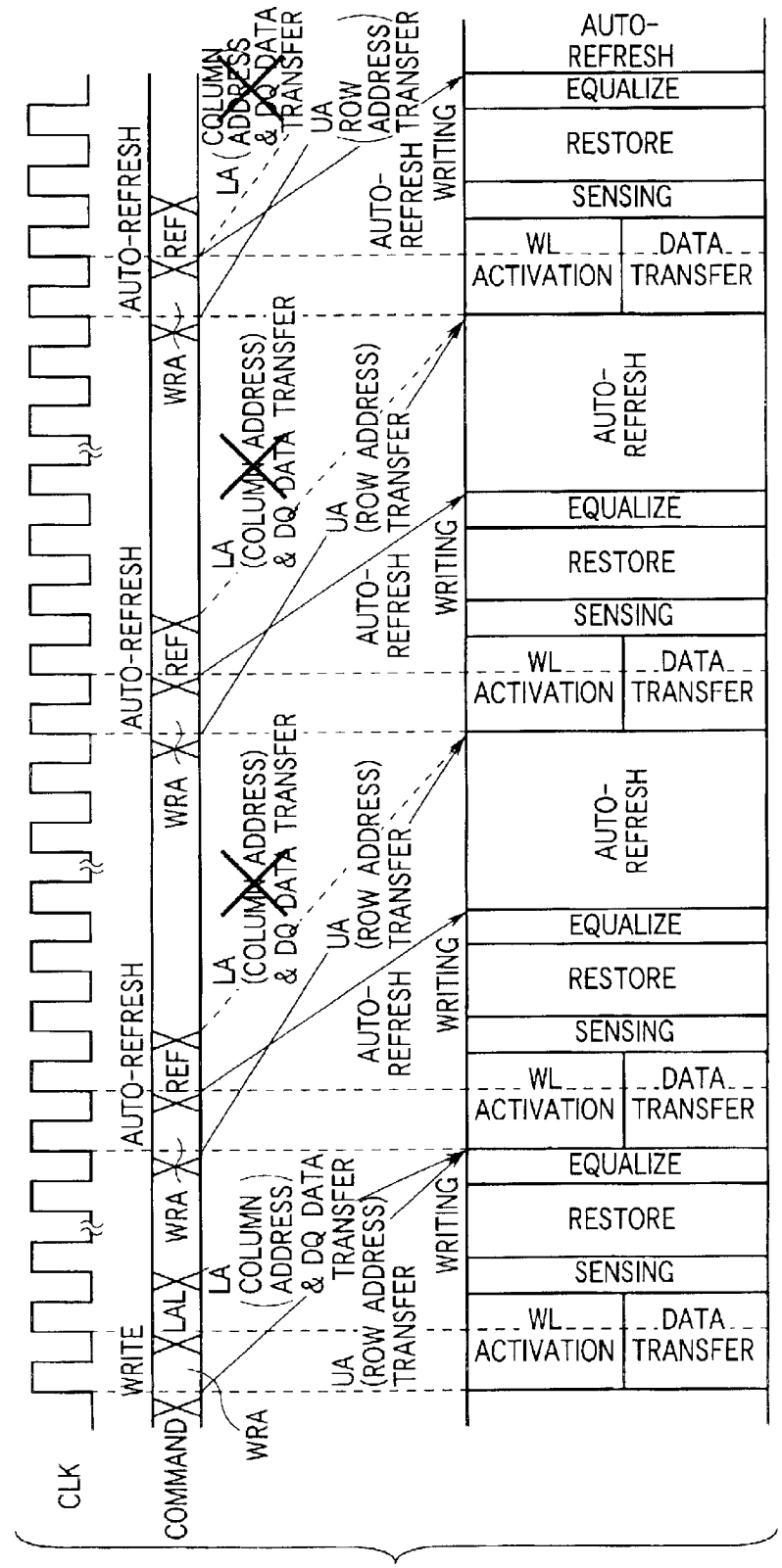
FIG. 8 is a timing chart showing the operation of the FCRAM when a plurality of auto-refresh cycles are successively performed.

FIG. 8 shows an outline of the operation when auto-refresh modes are successively performed.

An auto-refresh operation in a first auto-refresh mode is executed after the write operation in the immediately preceding write operation is completed. When this first auto-refresh mode is detected, row access is performed on the basis of only the UA (upper address), and word line activation and data transfer are executed. After data sensing and a data restore operation are performed and write operation is finished, bit line equalization is performed to prepare for the next auto refresh operation.

A write operation in a second auto-refresh mode is executed after the auto-refresh operation in the immediately preceding first auto-refresh mode is completed. When this second auto-refresh mode is detected, row access is performed on the basis of only the UA (upper address), and word line activation and data transfer are executed. After data sensing and a data restore operation are performed and write operation is finished, bit line equalization is performed to prepare for the next auto refresh operation.

In performing the auto-refresh mode, however, if the operation is started after the second command is input into the chip, the speed of this write and auto-refresh operation cannot be increased.

The write cycle and the auto-refresh cycle will be compared below.

Write Cycle

If the first command "WRA" is detected in the first write cycle, row and column addresses previously loaded in the immediately preceding write cycle are transferred to the memory core, and access is performed by using these row and column addresses. At the same time, if the first command "WRA" is detected in the first write cycle, data previously loaded in the immediately preceding write cycle is transferred to the memory core.

Also, if the first command "WRA" is detected in the first write cycle, a row address to be used in the second write cycle (or the auto-refresh cycle) to be executed after this cycle is loaded into the chip. Furthermore, if the second command "LAL" is detected in the first write cycle, a column address and data to be used in the second write cycle to be performed after this cycle are loaded into the chip.

Auto-Refresh Cycle

If the first command "WRA" is detected in the first auto-refresh cycle, a row address previously loaded into the chip in the immediately preceding write cycle is transferred to the memory core, and access is performed by using this row address.

Also, if the first command "WRA" is detected in the first auto-refresh cycle, a row address to be used in the second auto-refresh cycle (or the write cycle) to be performed after this cycle is loaded into the chip. Furthermore, if the second command "REF" is detected in the first auto-refresh cycle, a column address and data to be used in the write cycle to be performed after this cycle are loaded into the chip.

If the second command "RFE" is detected in the first auto-refresh cycle, the first auto-refresh operation is started after the immediately preceding write cycle (or auto-refresh cycle) is completed.

The FCRAM has a timer (or a counter) for a refresh operation. In the auto-refresh mode, a predetermined word line is automatically selected on the basis of the value (row address) of the timer, after the write operation in the immediately preceding mode is competed. In the auto-refresh mode, neither a column address is used nor data is loaded into the chip.

As described above, a large difference between the write cycle and the auto-refresh cycle is the operation after the second command is received. That is, in the write cycle, the operation of loading a column address and data into the chip is performed after the write cycle is determined by the first and second commands. By contrast, in the auto-refresh mode, this operation of loading a column address and data into the chip is not performed after the auto-refresh mode is determined by the first and second commands.

A case in which auto-refresh operations are successively performed will be described below.

As described above, neither a column address nor data is loaded into the chip in the auto-refresh mode.

Accordingly, after "REF" is detected as the second command, no column access needs to be performed. If column access is performed in the auto-refresh mode, data remaining on a data line in the immediately preceding write mode is transferred to a bit line to destroy the cell data.

Figure 9:
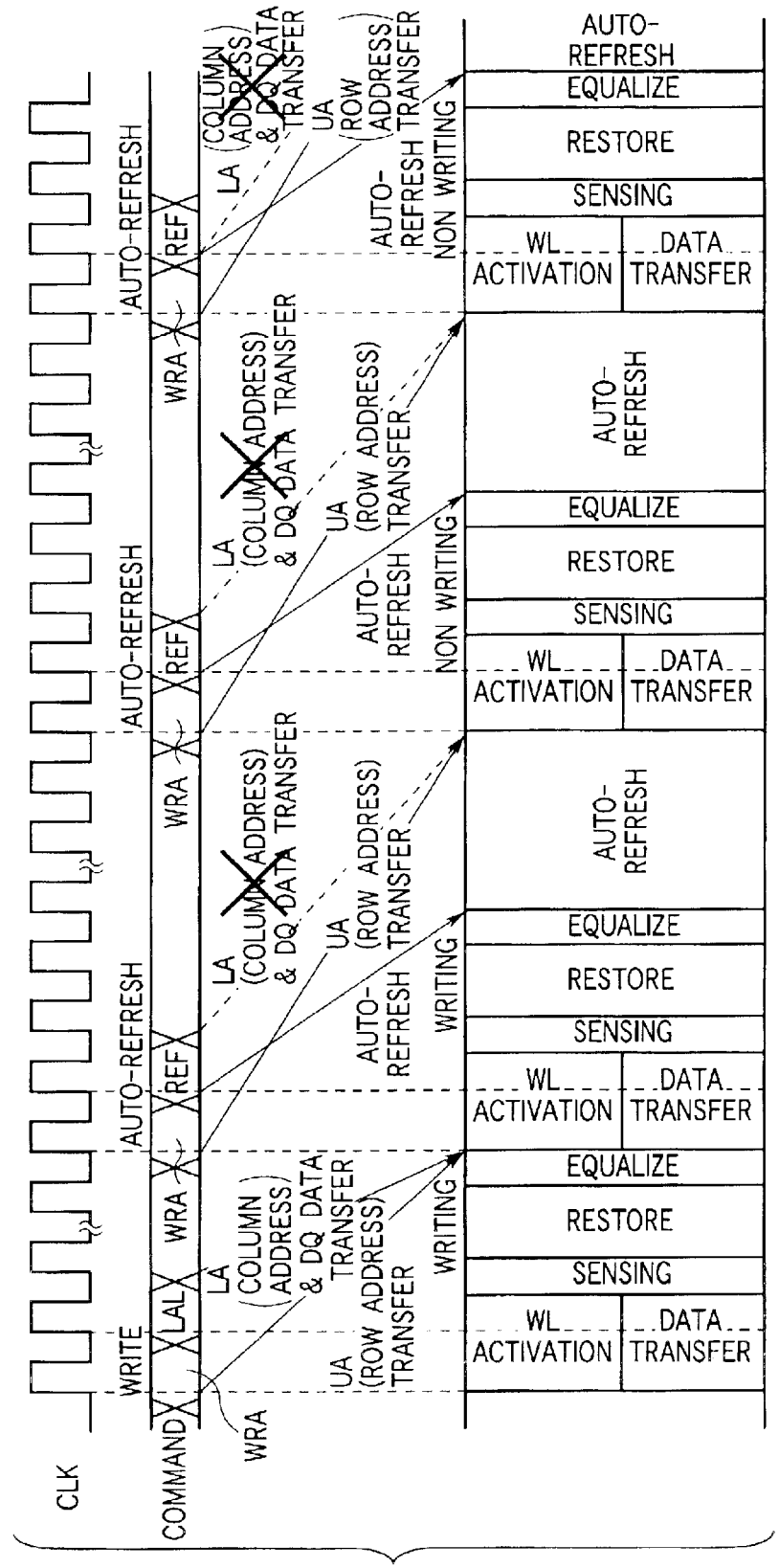
FIG. 9 is a timing chart showing the operation of the FCRAM when a write operation is omitted from an auto-refresh cycle.

As shown in FIG. 9, therefore, when auto-refresh operations are to be successively performed, no column access is performed after "REF" is detected as the second command in each auto-refresh operation, thereby preventing destruction of the cell data.

Also, in the auto-refresh mode as described above, a row address is supplied from the internal timer (or counter) of the chip to the memory core.

Accordingly, after "REF" is detected as the second command, row access need only be performed on the basis of an internal row address; no decoding for an external row address needs to be performed. If access based on an external row address is performed after "REF" is detected as the second command, the current consumption in the chip increases.

(2) First Embodiment

Figure 10:
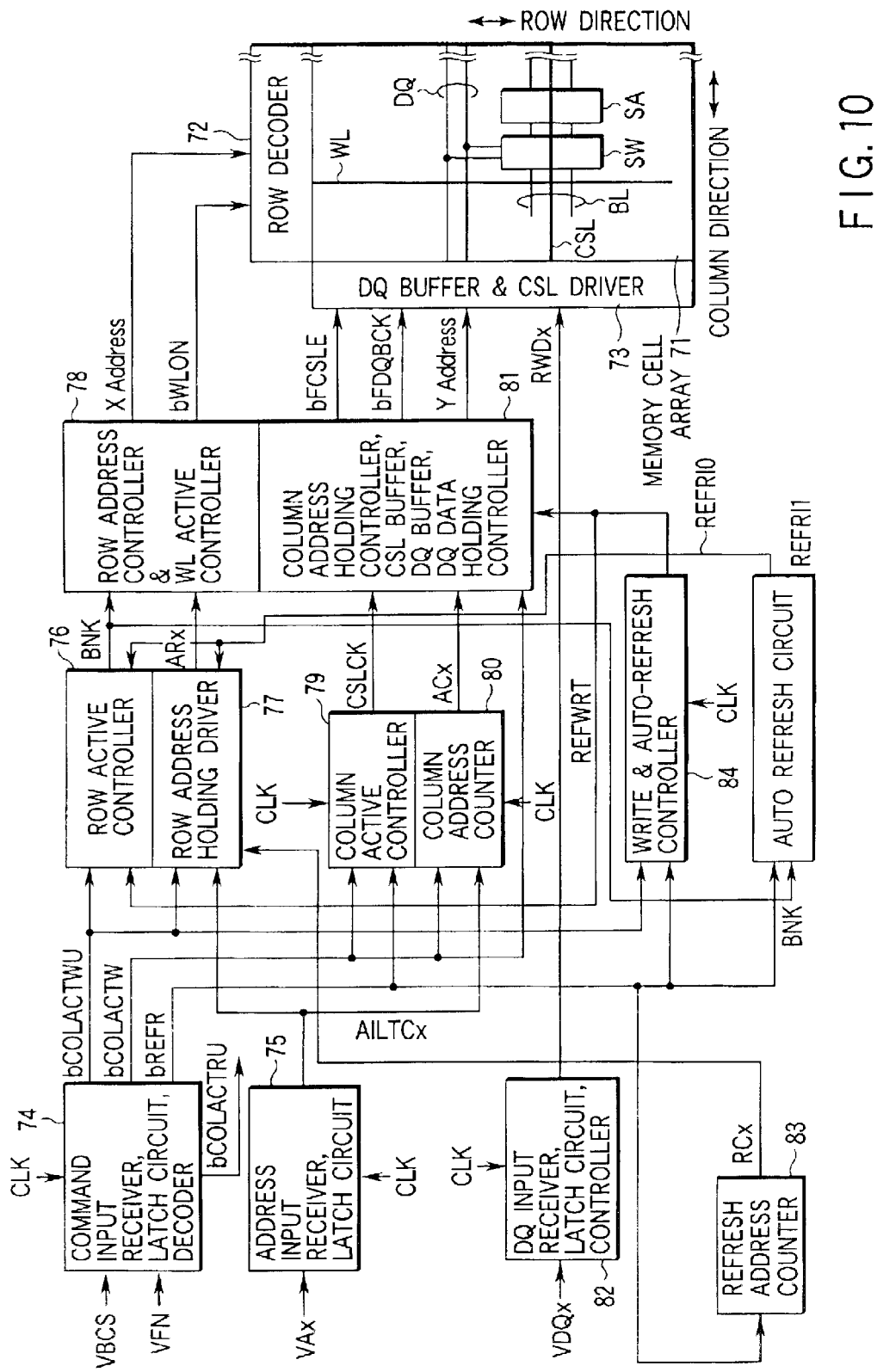
FIG. 10 is a view showing the first embodiment of a synchronous semiconductor memory of the present invention.

FIG. 10 shows the first embodiment of the synchronous semiconductor memory of the present invention.

This embodiment is based on a write control system of an SDR-FCRAM. However, the present invention is, of course, applicable to, e.g., a DDR-FCRAM having a data rate twice that of an SDR-FCRAM. In the following description, FCRAMs including these devices will be generally simply referred to as "FCRAMs".

This FCRAM has three buses: the first bus is a command bus for command data VBCS and VFN; the second bus is an address path for row and column addresses VAx; and the third bus is a data path for data VDQx. A write & auto-refresh controller 84 as one characteristic feature of the present invention performs write control, i.e., controls the statuses of these three buses during auto-refresh.

A memory cell array 71 includes a plurality of dynamic memory cells arranged in a matrix manner. Each dynamic memory cell is composed of one capacitor and one MOS transistor. Word lines WL extending in the row direction and bit line pairs BL extending in the column direction are arranged on the memory cell array 71.

Each bit line pair BL is connected to a sense amplifier SA and a column switch SW. This column switch SW is connected to a DQ line pair (data line pair) DQ which extends in the column direction. Column-select lines CSL extend in the column direction on the memory cell array 71 and are connected to the column switches SW.

A row decoder 72 is connected to the word lines WL and controls the potentials of these word lines WL. A CSL driver 73 is connected to the column-select lines CSL and controls the potentials of these column-select lines CSL, i.e., controls ON/OFF of the column switches SW. A DQ buffer 73 is connected to the DQ line pairs DQ to transfer data to or receive data from these DQ line pairs DQ.

Data write to this memory cell array 71 is enabled by a write command input into the chip in synchronism with an external clock. Data read to the memory cell array 71 is enabled by a read command input into the chip in synchronism with the external clock.

A command input receiver 74 receives command signals VBCS and VFN. A latch circuit 74 latches the command signals VBCS and VFN in synchronism with the external clock. A decoder 74 decodes the command signals VBCS and VFN latched by the latch circuit 74, and outputs signals bCOLACTWU, bCOLACTRU, bCOLACTW, and bREFR.

The command input receiver, latch circuit, and decoder 74 includes, e.g., the circuits shown in FIGS. 3 to 5.

The command input receiver, latch circuit, and decoder 74 decodes first and second commands in synchronism with the external clock. First, whether the first command is "RDA" or "WRA" is determined. Subsequently, whether the second command is "LAL" or "MRS" is determined. Mode selection is performed on the basis of these first and second commands.

An address input receiver 75 receives the row and column address signal VAx. A latch circuit 75 latches the row and column address signal Vax in synchronism with the external clock. The address input receiver and latch circuit 75 outputs a signal (address signal) AILTCx (x=0, 1, 2, . . . )

A row active controller 76 receives the output signal bCOLACTWU from the command input receiver, latch circuit, and decoder 74, and outputs a row active (bank active) signal BNK.

A row address holding driver 77 receives the output signal BCOLACTWU from the command input receiver, latch circuit, and decoder 74. Also, this row address holding driver 77 selects one of the output signal AILTCx from the address input receiver and latch circuit 75 and an output signal (refresh address signal) RCx from a refresh address counter 83. The selected output signal is output as a row address signal ARx from the row address holding driver 77.

A row address controller & WL active controller 78 receives the row active (bank active) signal BNK and the row address signal ARx, and supplies a row address signal X Address and a word line drive signal bWLON to the row decoder 72.

A column active controller 79 receives the output signals bCOLACTW and bREFR from the command input receiver, latch circuit, and decoder 74, and outputs a column-select clock CSLCK in synchronism with a clock CLK.

A column address counter 80 receives the output signal bCOLACTWU from the command input receiver, latch circuit, and decoder 74 and the output signal AILTCx from the address input receiver 75, and outputs a column address signal ACx.

A column address holding controller 81 receives the column-select clock CSLCK and the column address signal ACx. The CSL buffer 81 outputs a column-select signal bFCSLE and a column address signal Y Address. On the basis of these column-select signal bFCSLE and column address signal Y Address, the CSL driver 73 determines the potential of the column-select line CSL. A DQ data holding controller 81 outputs a clock bFDQBCK for controlling the DQ buffer.

A DQ input receiver 82 receives the write data VDQx. A latch circuit 82 latches this write data VDQx. A controller 82 outputs write data RWDx in synchronism with the clock CLK.

When the first command is "WRA" and the second command is "LAL", the column address holding controller 81 and the DQ data holding controller 81 receive the signal bCOLACTW and perform a random access operation and a write operation in synchronism with the clock CLK. During these operations, the column address holding controller 81 and the DQ data holding controller 81 perform pipeline controlling for an address signal and write data.

The refresh address counter 83 receives the output signal bREFR from the command input receiver, latch circuit, and decoder 74, and outputs a refresh address signal RCx.

When the first command is "WRA" and the second command is "REF", an auto-refresh circuit 85 receives the signal bREFR and outputs an auto-refresh signal REFRI. This auto-refresh signal REFRI is input to the row active controller 76 and the row address holding driver 77. Upon receiving the auto-refresh signal REFRI, the row address holding driver 77 selects the output address RCx from the refresh address counter 83.

When the first command is "WRA" and the second command is "REF", the write & auto-refresh controller 84 receives the signals bCOLACTWU and bREFR and outputs a write signal REFWRT.

In auto-refresh mode, the auto-refresh circuit 85 and the write & auto-refresh controller 84 perform random access and data write by using row and column addresses previously loaded into the chip in an immediately preceding write cycle. After the data write is completed, row precharge is performed, and auto-refresh is started.

Figure 11:
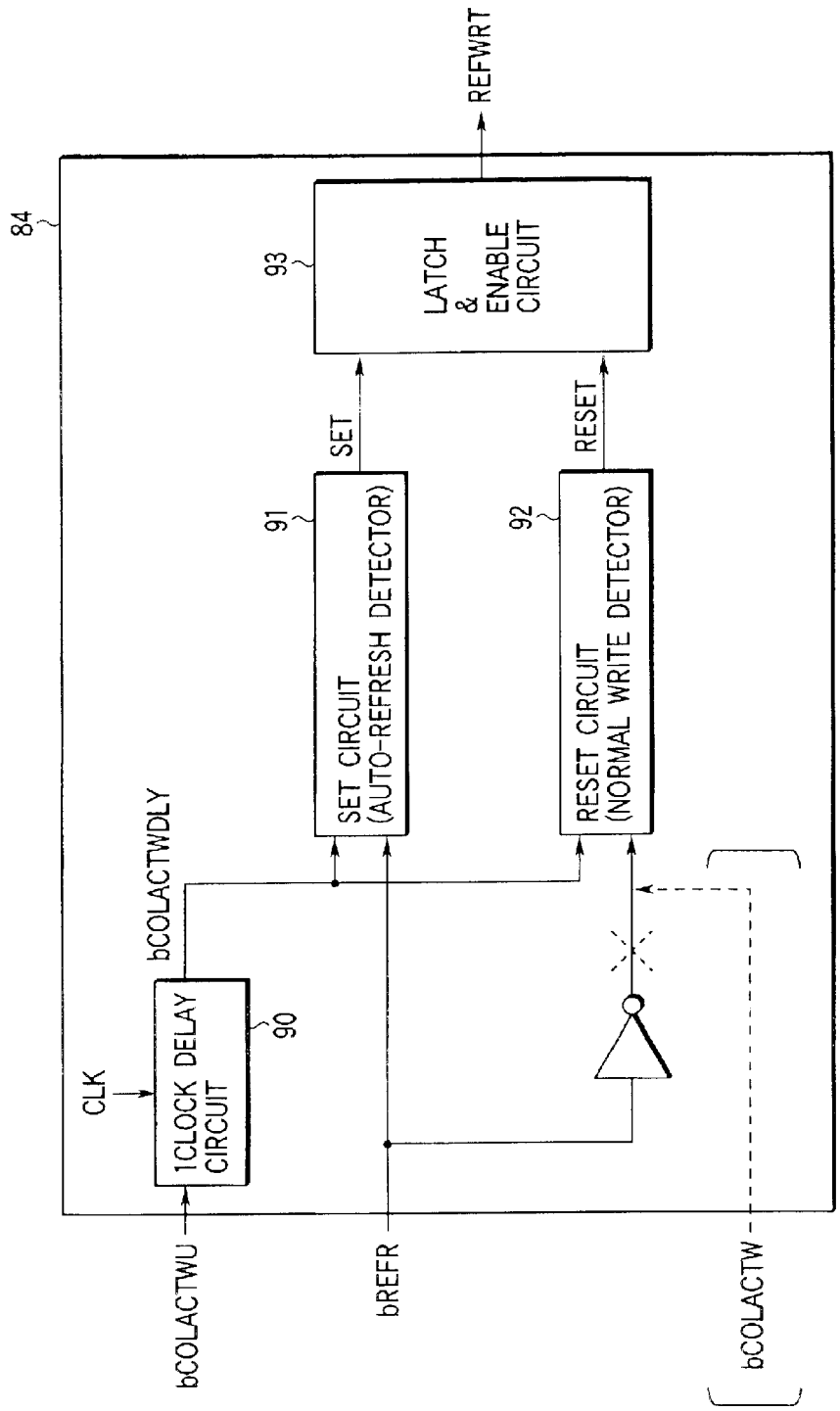
FIG. 11 is a view showing an example of a write & auto-refresh controller.

FIG. 11 shows a practical example of the write & auto-refresh controller 84 shown in FIG. 10.

The operation of this write & auto-refresh controller 84 will be described below.

If "WRA" is input as the first command in write mode and auto-refresh mode, the signal bCOLACTWU changes to level "L" for a half period of the clock CLK. If "LAL" is input as the second command after that, the write mode is determined; if "REF" is input as the second command, the auto-refresh mode is determined.

If "LAL" is input as the second command, the signal bCOLACTW changes to level "L" for a half period of the clock CLK. If "REF" is input as the second command, the signal bREFR changes to level "L" for a half period of the clock CLK.

A 1 clock delay circuit 90 delays the signal bCOLACTWU by one clock. That is, an output signal from this 1 clock delay circuit 90 is a signal bCOLACTWDLY obtained by delaying the signal bCOLACTWU by one clock. The signals bREFR and bCOLACTWDLY are input to a set circuit (auto-refresh detector) 91. The signal bREFR (or the signal bCOLACTW) and the signal bCOLACTWDLY are input to a reset circuit (normal write detector) 92.

In auto-refresh mode, the signals bCOLACTWDLY and bREFR are at level "L". An output signal SET from the set circuit 91 and an output signal RESET from the reset circuit 92 are input to a latch & enable circuit 93. In auto-refresh mode, an output signal REFWRT from this latch & enable circuit 93 is at level "H".

In write mode, the signal bCOLACTWDLY changes to level "L", and the signal bREFR changes to level "H". Accordingly, the latch & enable circuit 93 is reset by the reset signal RESET from the reset circuit 92.

Figure 12:
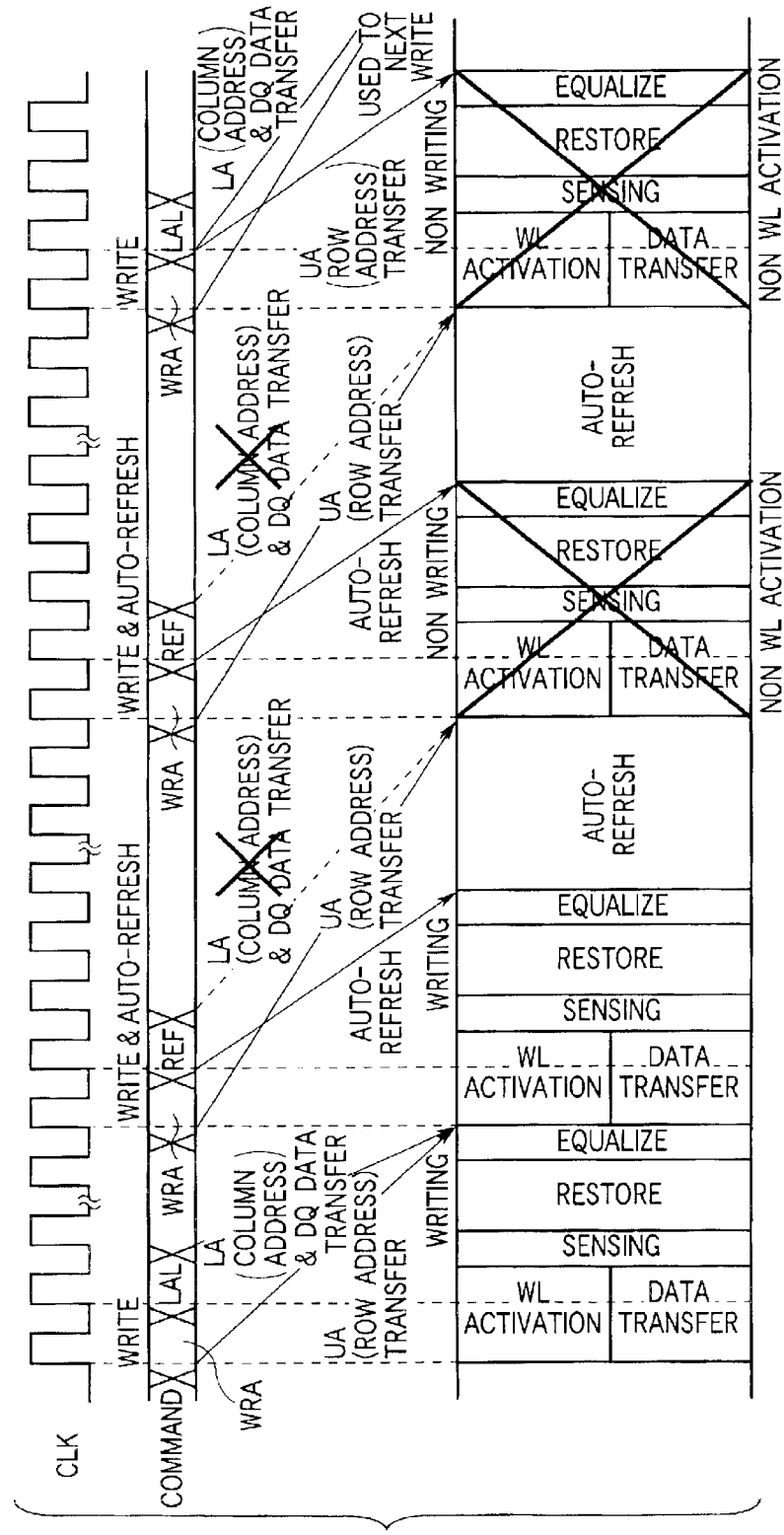
FIG. 12 is a timing chart when a plurality of auto-refresh cycles are successively performed.

FIG. 12 shows an operating waveform when a plurality of auto-refresh cycles are successively performed after a write cycle in the FCRAM shown in FIG. 10.

In this embodiment, predetermined commands are input into the chip so that the memory operates in the order of write→auto-refresh→auto-refresh→write.

Figure 13:
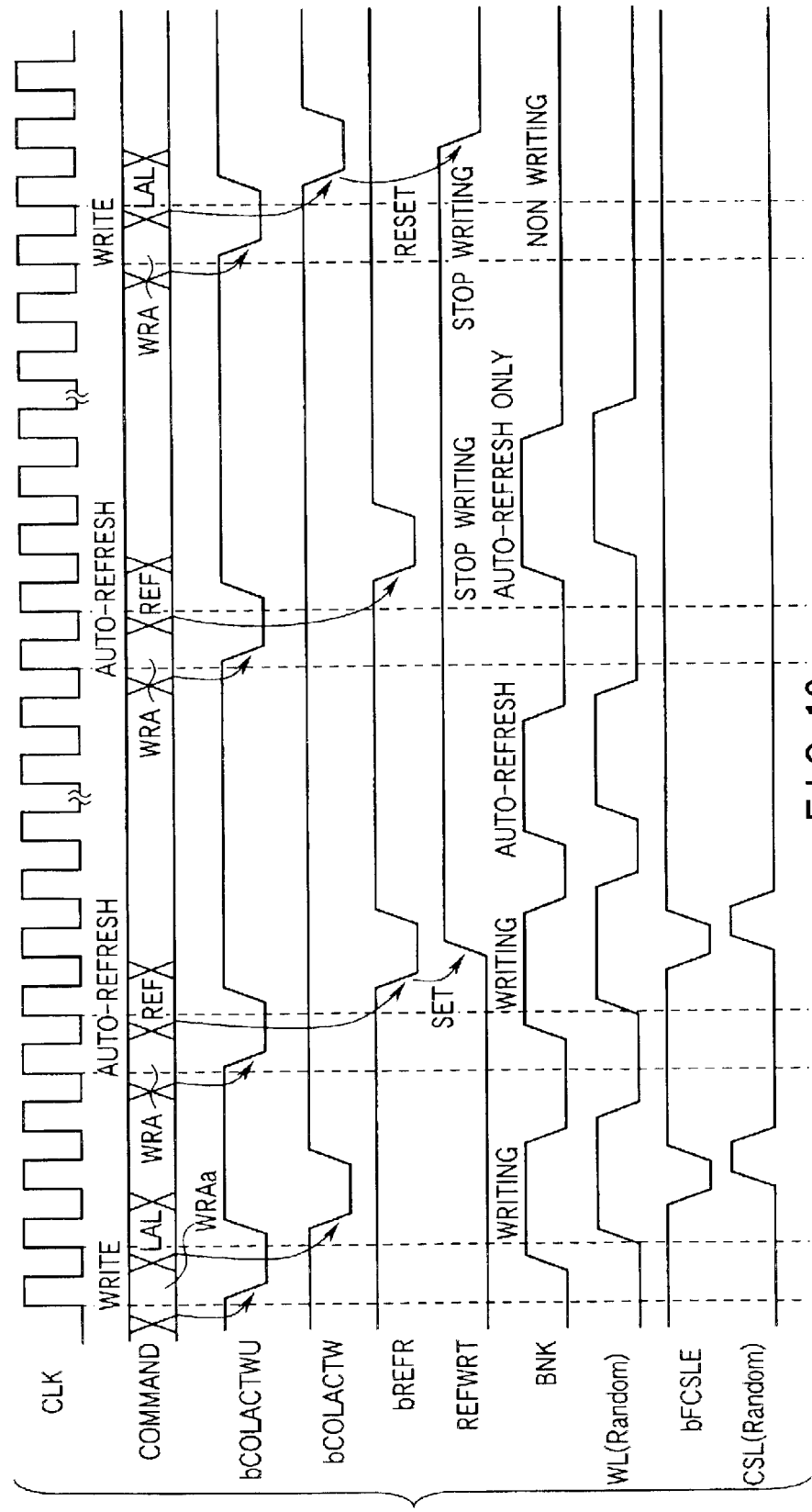
FIG. 13 is a timing chart showing the operation of a write & auto-refresh controller.

FIG. 13 shows the operating waveforms of an FCRAM having the arrangements as shown in FIGS. 10 and 11.

In a first write cycle, the signal bCOLACTWU changes to level "L", and the row active (bank active) signal BNK changes to level "H". Also, the potential of the selected word line WL changes to level "H", and the signal bCOLACTW changes to level "L". As a result, the signal bFCSLE changes to level "L", the column-select signal CSL changes to level "H", and a write operation is performed.

In a first auto-refresh cycle immediately after this first write cycle, the signal bCOLACTWU changes to level "L", and the signal bREFR changes to level "L". Consequently, the output signal REFWRT from the write & auto-refresh controller 84 changes to level "H". Note that this first auto-refresh cycle cannot be performed unless the write operation in the first write cycle is completed. That is, even in a pipeline operation, an auto-refresh operation is performed after a write operation is completed.

Since the write operation is already completed in the first auto-refresh cycle, it is possible in a second auto-refresh cycle to perform only an auto-refresh operation by inhibiting a write operation by using the output signal REFWRT from the write & auto-refresh controller 84.

The write operation is already completed in the first auto-refresh cycle. In a second write cycle, therefore, similar to the second auto-refresh cycle, a write operation can be inhibited by using the output signal REFWRT from the write & auto-refresh controller 84.

By the above control, it is possible to prevent activation of word lines by an unnecessary write operation, improve the reliability of memory cells connected to word lines, and suppress the current consumption during auto-refresh.

Also, as shown in FIG. 13, no write operation is necessary in the second and subsequent auto-refresh cycles of a plurality of successive auto-refresh cycles, so this write operation can be omitted. That is, from the second auto-refresh cycle, the completion of a write operation need not be waited for, and an auto-refresh operation can be immediately started.

Since a write operation is necessary in the first auto-refresh cycle, a refresh cycle tREFC in this cycle remains unchanged. However, if a plurality of successive auto-refresh cycles are present, the refresh cycle tREFC of the second and subsequent cycles can be shortened. That is, the start timing of an auto-refresh operation from the second cycle can be made earlier, and this can increase the margin of the refresh cycle tREFC.

In the first embodiment of the present invention as described above, it is possible to increase the data write speed and shorten a random access cycle tRC by pipelining access and precharge to the memory cell array. Also, when a plurality of auto-refresh cycles are to be successively performed, operation errors during auto-refresh can be eliminated by omitting unnecessary write operations.

That is, of a plurality of successive auto-refresh cycles, no column access is performed from the second auto-refresh cycle, thereby inhibiting writing of write data. This makes it possible to avoid the problem of cell data destruction occurring when column access is performed. It is also possible to reduce the current consumption in auto-refresh mode and improve the reliability of memory cells. Furthermore, the margin of the cycle time tREFC from the second auto-refresh cycle can be increased.

Also, of a plurality of successive auto-refresh cycles, no row access using an external row address is performed in the second and later auto-refresh cycles. This can completely inhibit unnecessary write operation.

(3) Second Embodiment

An embodiment in which the present invention is applied to an FCRAM having a plurality of banks will be described below. A DRAM having a plurality of banks is disclosed in, e.g., "A Pseudo MultiBank DRAM with Catagorized Access Sequence" (VLSI Symp. 1999, pp. 90–93).

Figure 15:
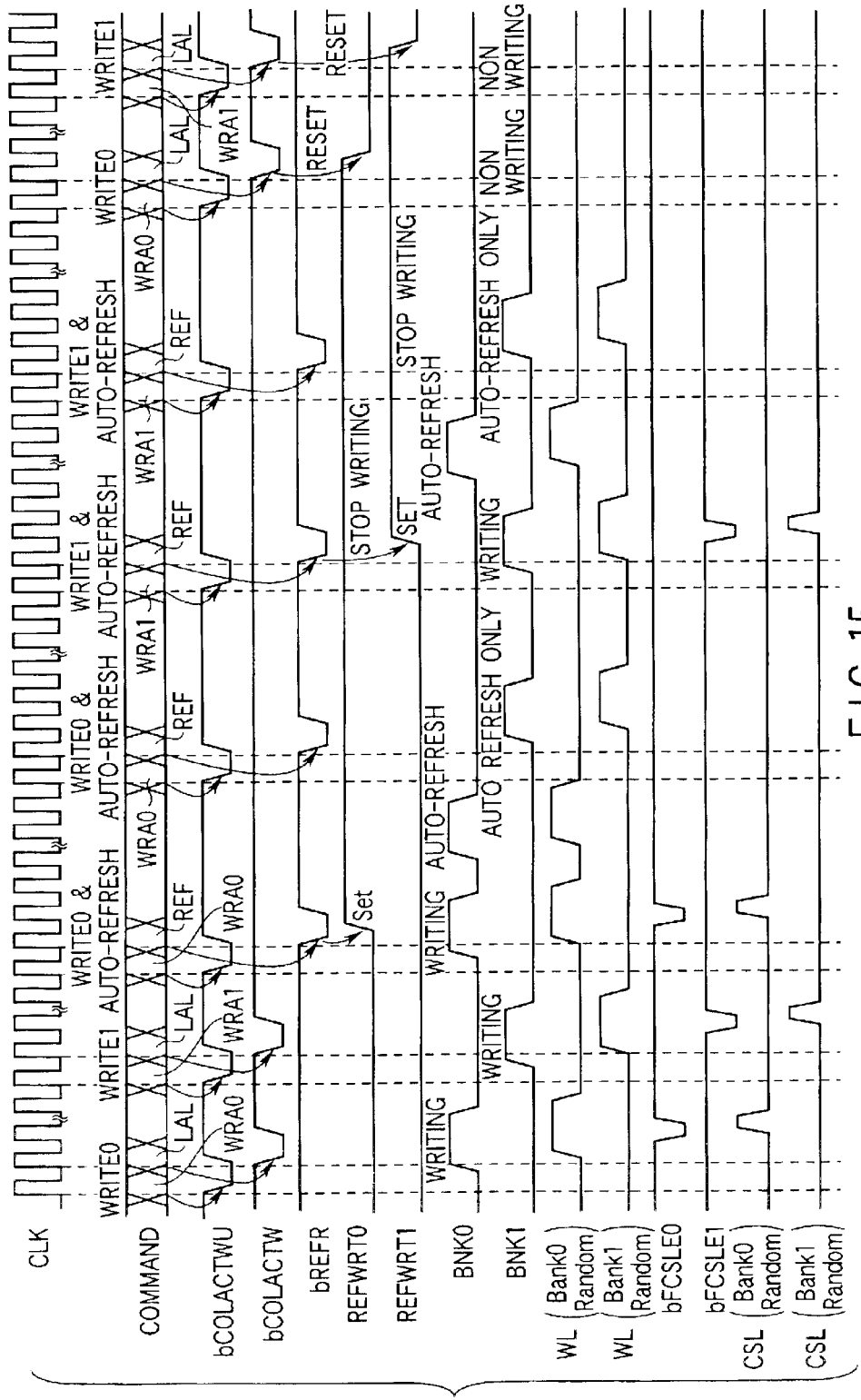
FIG. 15 is a timing chart showing the operation of the FCRAM in FIG. 14.

FIG. 14 illustrates the second embodiment of the synchronous semiconductor memory of the present invention. FIG. 15 shows the operating waveforms of the memory shown in FIG. 14.

This embodiment is based on a write control system. However, the present invention is naturally applicable to another memory, e.g., a DDR-FCRAM having a data rate twice that of an SDR-FCRAM.

In this system, portions enclosed with the broken lines in FIG. 14 function as banks. In this embodiment, two banks, i.e., bank 0 (BNK0) and bank 1 (BNK1) are arranged in a memory chip. FIG. 14 depicts only the circuit blocks of bank 0 (BNK0). However, bank 1 (BNK1) has circuit blocks identical with those of bank 0 (BNK0).

A memory cell array 71 includes a plurality of dynamic memory cells arranged in a matrix manner. Each dynamic memory cell is composed of one capacitor and one MOS transistor. Word lines WL extending in the row direction and bit line pairs BL extending in the column direction are arranged on the memory cell array 71.

Each bit line pair BL is connected to a sense amplifier SA and a column switch SW. This column switch SW is connected to a DQ line pair (data line pair) DQ which extends in the column direction. Column-select lines CSL extend in the column direction on the memory cell array 71 and are connected to the column switches SW.

A row decoder 72 is connected to the word lines WL and controls the potentials of these word lines WL. A CSL driver 73 is connected to the column-select lines CSL and controls the potentials of these column-select lines CSL, i.e., controls ON/OFF of the column switches SW. A DQ buffer 73 is connected to the DQ line pairs DQ to transfer data to or receive data from these DQ line pairs DQ.

Data write to this memory cell array 71 is enabled by a write command input into the chip in synchronism with an external clock. Data read from the memory cell array 71 is enabled by a read command input into the chip in synchronism with the external clock.

A command input receiver 74 receives command signals VBCS and VFN. A latch circuit 74 latches the command signals VBCS and VFN in synchronism with the external clock. A decoder 74 decodes the command signals VBCS and VFN latched by the latch circuit 74, and outputs signals bCOLACTWU, bCOLACTRU, bCOLACTW, and bREFR.

The command input receiver, latch circuit, and decoder 74 includes, e.g., the circuits shown in FIGS. 3 to 5.

The command input receiver, latch circuit, and decoder 74 decodes first and second commands in synchronism with the external clock. First, whether the first command is "RDA" or "WRA" is determined. Subsequently, whether the second command is "LAL" or "MRS" is determined. Mode selection is performed on the basis of these first and second commands.

An address input receiver 75 receives a row and column address signal VAx. A latch circuit 75 latches the row and column address signal VAx in synchronism with the external clock. The address input receiver and latch circuit 75 outputs a signal (address signal) AILTCx (x=0, 1, 2, . . . )

A row active controller 76 receives the output signal bCOLACTWU from the command input receiver, latch circuit, and decoder 74, and outputs a row active (bank active) signal BNK.

A row address holding driver 77 receives the output signal bCOLACTWU from the command input receiver, latch circuit, and decoder 74. Also, this row address holding driver 77 selects one of the output signal AILTCx from the address input receiver and latch circuit 75 and an output signal (refresh address signal) RCx from a refresh address counter 83. The selected output signal is output as a row address signal ARx from the row address holding driver 77.

A row address controller & WL active controller 78 receives the row active (bank active) signal BNK and the row address signal ARx, and supplies a row address signal X Address and a word line drive signal bWLON to the row decoder 72.

A column active controller 79 receives the output signals bCOLACTW and bREFR from the command input receiver, latch circuit, and decoder 74, and outputs a column-select clock CSLCK in synchronism with a clock CLK.

A column address counter 80 receives the output signal bCOLACTWU from the command input receiver, latch circuit, and decoder 74 and the output signal AILTCx from the address input receiver 75, and outputs a column address signal ACx.

A column address holding controller 81 receives the column-select clock CSLCK and the column address signal ACx. The CSL buffer 81 outputs a column-select signal bFCSLE and a column address signal Y Address. On the basis of these column-select signal bFCSLE and column address signal Y Address, the CSL driver 73 determines the potential of the column-select line CSL. A DQ data holding controller 81 outputs a clock bFDQBCK for controlling the DQ buffer.

A DQ input receiver 82 receives write data VDQx. A latch circuit 82 latches this write data VDQx. A controller 82 outputs write data RWDx in synchronism with the clock CLK.

When the first command is "WRA" and the second command is "LAL", the column address holding controller 81 and the DQ data holding controller 81 receive the signal bCOLACTW and perform a random access operation and a write operation in synchronism with the clock CLK. During these operations, the column address holding controller 81 and the DQ data holding controller 81 perform pipeline controlling for an address signal and write data.

The refresh address counter 83 receives the output signal bREFR from the command input receiver, latch circuit, and decoder 74, and outputs a refresh address signal RCx.

When the first command is "WRA" and the second command is "REF", an auto-refresh circuit 85 receives the signal bREFR and outputs auto-refresh signals REFRI0 and REFRI1.

The auto-refresh signal REFRI0 is input to the row active controller 76 and the row address holding driver 77 in the bank BNK0. Upon receiving this auto-refresh signal REFRI0, the row address holding driver 77 in the bank BNK0 selects the output internal address RCx from the refresh address counter 83.

The auto-refresh signal REFRI1 is input to a row active controller and a row address holding driver in the bank BNK1. Upon receiving this auto-refresh signal REFRI1, the row address holding driver in the bank BNK1 selects an internal address from a refresh address counter.

Bank-select signals BNK0 and BNK1 and the internal address signal RCx are input to the auto-refresh circuit 85. The bank-select signals BNK0 and BNK1 are used to select the banks BNK0 and BNK1, respectively.

When the first command is "WRA", the write & auto-refresh controller 84 receives the signals bCOLACTWU and bREFR and outputs a write signal REFWRT.

In auto-refresh mode, the auto-refresh circuit 85 and the write & auto-refresh controller 84 perform random access and data write by using row and column addresses previously loaded into the chip in an immediately preceding write cycle. After the data write is completed, row precharge is performed, and auto-refresh is started.

Bank 0 (BNK0) has the memory cell array 71, the row decoder 72, the DQ buffer & CSL driver 73, the row active controller 76, the row address holding driver 77, the row address controller & WL active controller 78, the column address holding controller, CSL buffer, DQ buffer, and DQ data holding controller 81, and the write & auto-refresh controller 84.

The auto-refresh circuit 85 is shared by bank 0 (BNK0) and bank 1 (BNK1). For example, after a write cycle is completed, the levels of the Bank-select signals BNK0, BNK1 are become "L", respectively. As the result, the write operation is finished. When bank 0 (BNK0) is selected, REFRI0 changes to level "H"; when bank 1 (BNK1) is selected, REFRI1 changes to level "H". In the selected bank, an auto-refresh operation is executed.

According to the waveform examples shown in FIG. 15, an auto-refresh operation is first executed for the bank BNK0, then executed for the bank BNK1, and again executed for the bank BNK0. That is, in FIG. 15 an auto-refresh operation is alternately executed for the banks BNK0 and BNK1.

This operation is readily realizable by the use of a part of the output internal address from the refresh address counter 83. More specifically, a least significant bit RC0 of the internal address is switched between "L" and "H" every cycle. The two banks BNK0 and BNK1 are alternately selected by using this switching of the least significant bit RC0 of the internal address.

A specific operation is as follows.

First, a first write cycle is executed for the bank BNK0. After that, a first write cycle is executed for the bank BNK1.

Subsequently, a first auto-refresh cycle is executed for the bank BNK0. During this cycle, a first write operation is executed for the bank BNK0 by using row and column addresses and DQ data loaded into the chip when the first write cycle is executed for the bank BNK0. After this first write operation and row precharge are completed, a first auto-refresh operation for the bank BNK0 is started.

Also, a first auto-refresh cycle is executed for the bank BNK1. During this cycle, a first write operation is executed for the bank BNK1 by using row and column addresses and DQ data loaded into the chip when the first write cycle is executed for the bank BNK1. After this first write operation and row precharge are completed, a first auto-refresh operation for the bank BNK1 is started.

When the bank BNK0 is selected, no write operation needs to be executed for the bank BNK1; when the bank BNK1 is selected, no write operation needs to be executed for the bank BNK0. When the bank BNK0 is selected, a write control signal REFWRT0 changes to level "H" to inhibit a write operation in this bank BNK0; when the bank BNK1 is selected, a write control signal REFWRT1 changes to level "H" to inhibit a write operation in this bank BNK1.

When the fourth cycle is an auto-refresh cycle as depicted in FIG. 15, the write operation in the bank BNK0 is already completed before this cycle, so an auto-refresh operation alone needs to be performed.

If the auto-refresh control signal REFWRT0 is at level "H", no row circuits are rendered active by write operation in the bank BNK0. When the signal bREFR changes to level "L", the auto-refresh circuit 85 changes the output signal REFRI1 to level "H" and perform only auto-refresh for the bank BNK1.

In the fifth cycle, an auto-refresh cycle for the bank BNK1 is executed. That is, an auto-refresh operation is executed after a write operation is performed by using the addresses and DQ data loaded in the write cycle executed for the bank BNK1 in the second cycle. After that, similar to the bank BNK0, the write control signal REFWRT1 for the bank BNK1 is changed to level "H" to inhibit a write operation for this bank BNK1.

In the sixth cycle, an auto-refresh cycle for the bank BNK1 is executed. Since the write operation for this bank BNK1 is already completed before this cycle, an auto-refresh operation is immediately executed without performing any write operation.

Since the auto-refresh control signal REFWRT1 is at level "H", no row circuits are rendered active by a write operation. Therefore, when the signal bREFR changes to level "L", the auto-refresh circuit 85 changes the output signal REFRI1 to level "H" and performs only auto-refresh for the bank BNK1.

In the seventh cycle, a write cycle for the bank BNK0 is executed. Since no write operation is performed, addresses and DQ data are immediately loaded into the chip.

In the eighth cycle, a write cycle for the bank BNK1 is executed. In this cycle, the write control signal REFWRT0 of the bank BNK0 is set at level "L" to perform a write operation for the DQ data input into the chip in the seventh cycle.

As described above, auto-refresh control according to the present invention can be performed even in an FCRAM having two banks.

(4) Modification of Second Embodiment

In the second embodiment, the number of banks is two. However, the present invention is applicable to an FCRAM having three or more banks.

Figure 16:
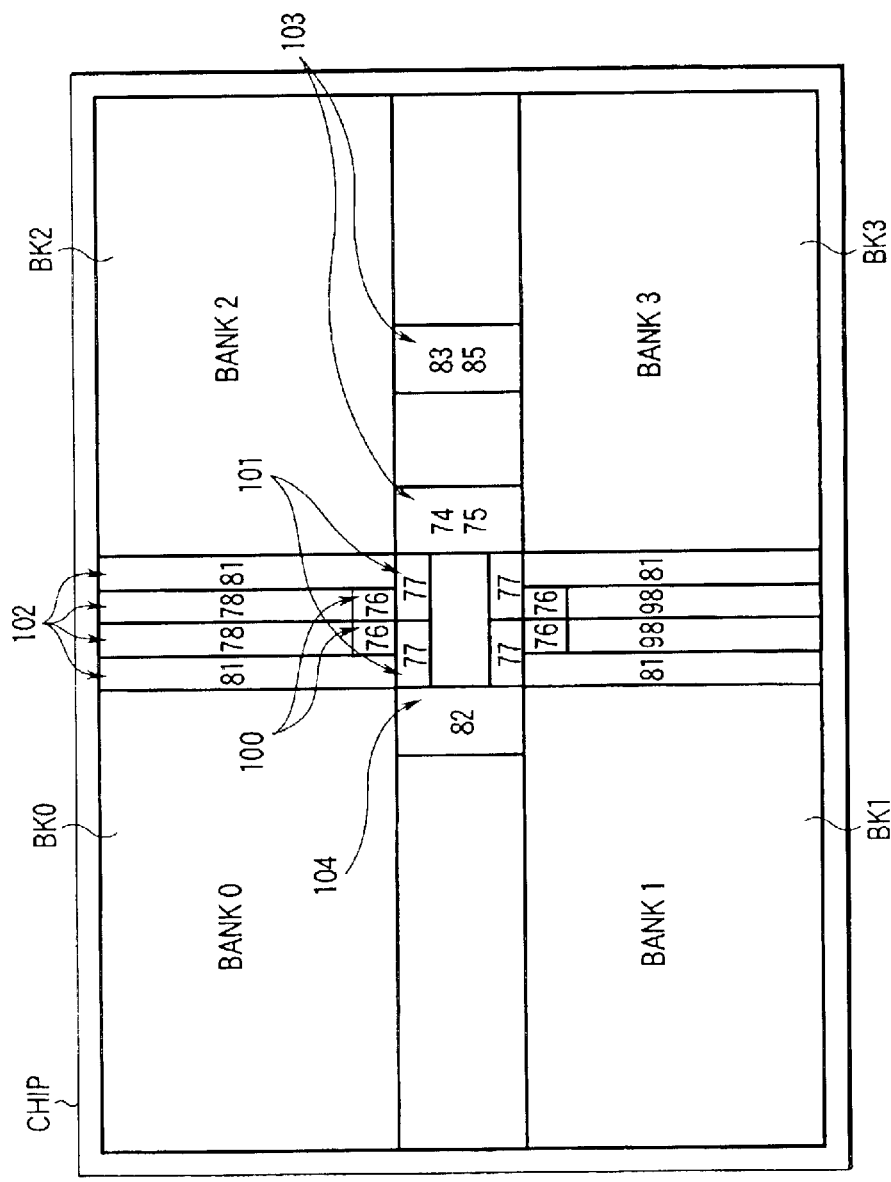
FIG. 16 is a view showing an example of the chip layout of the FCRAM in FIG. 14.

FIG. 16 schematically shows the layout of an FCRAM having four banks.

In this modification, four banks (cell arrays) BK0 to BK3 are arranged in two rows×two columns on an FCRAM chip.

In a central region 100 on the chip, row active controllers 76 are arranged in one-to-one correspondence with the banks BK0 to BK3. In a central region 101 on the chip, row address holding drivers 77 are arranged in one-to-one correspondence with the banks BK0 to BK3.

In a region 102, row address controllers & WL active controllers 78, a column active controller 79, a column address counter 80, and column address holding controllers, CSL buffers, DQ buffers and DQ data holding controllers 81 are arranged in one-to-one correspondence with the banks BK0 to BK3.

In a region 103, the four banks BK0 to BK3 share a command input receiver, latch circuit, and decoder 74, an address input receiver and latch circuit 75, a refresh address counter 83, and an auto-refresh circuit 85.

In a region 104, a DQ input receiver, latch circuit, and controller 82 is formed.

(5) Third Embodiment.

This embodiment relates to a case in which a read cycle is inserted between a plurality of auto-refresh cycles.

When a read cycle is inserted between a plurality of auto-refresh cycles, a write control signal REFWRT must be temporarily set at level "L" to perform row access and column access during the read cycle. Hence, a signal bCO-LACTRU which changes to "L" when "RDA" is detected as the first command is used to temporarily set the write control signal REFWRT at level "L".

Figure 17:
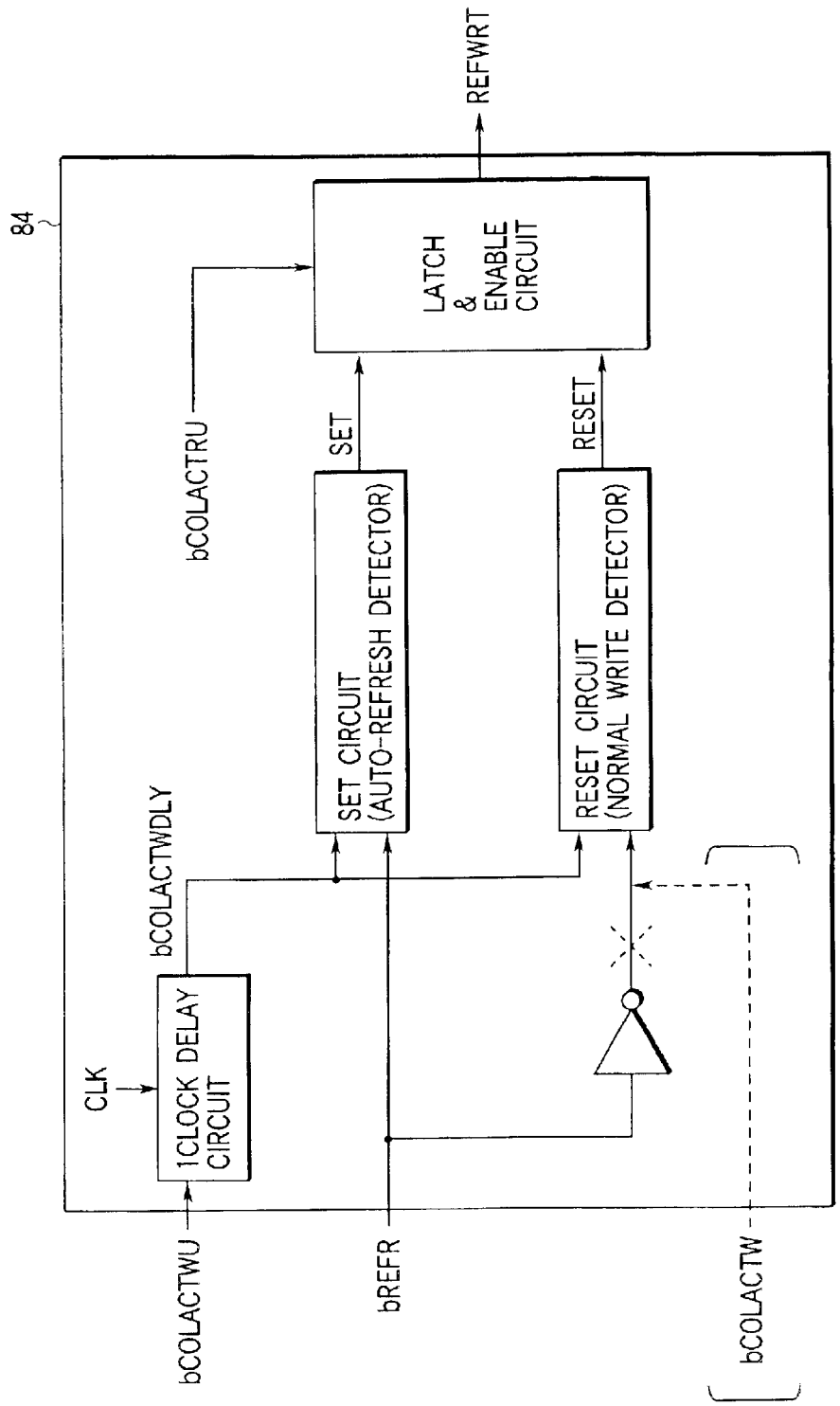
FIG. 17 is a view showing an example of a write & auto-refresh controller.
Figure 18:
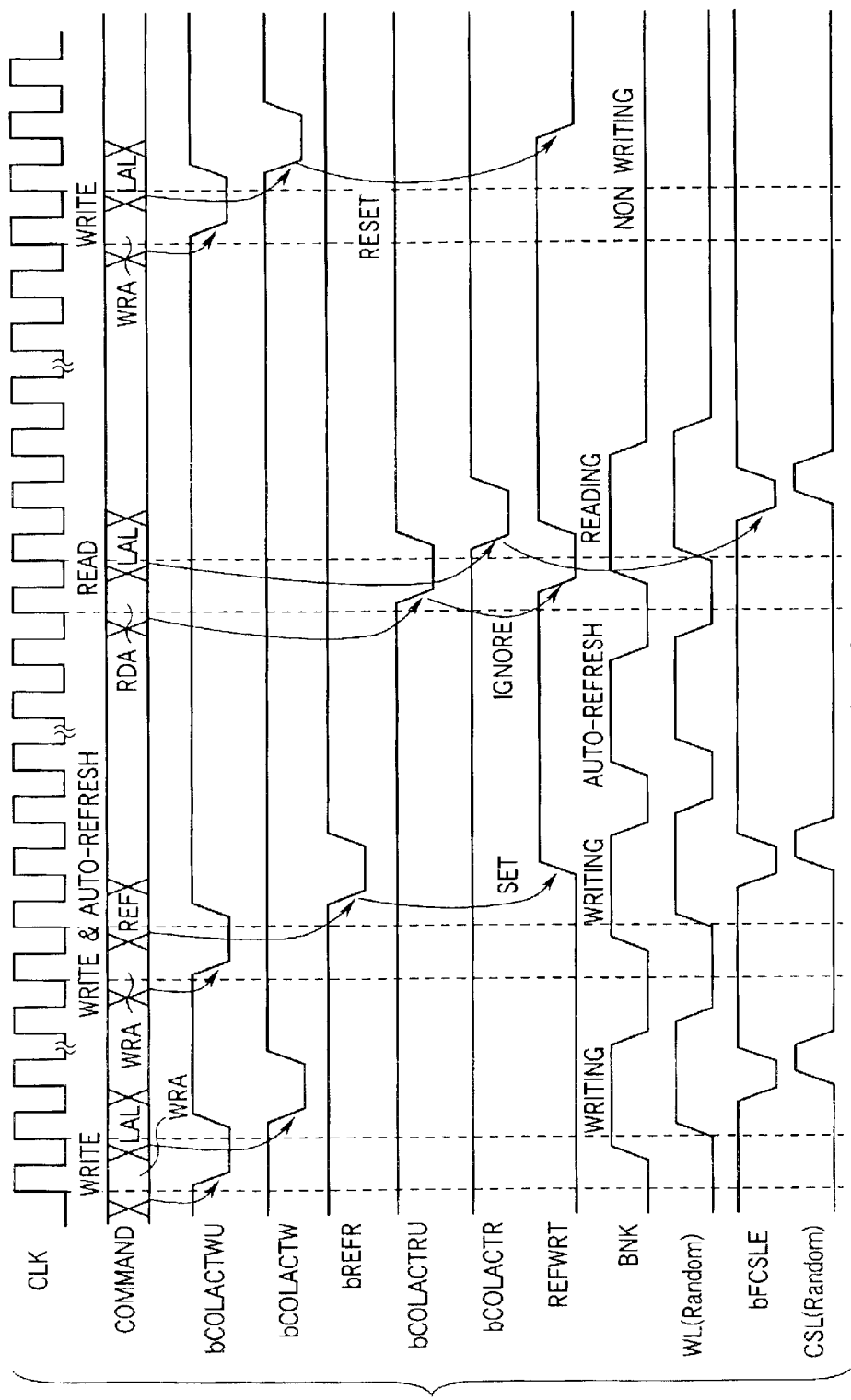
FIG. 18 is a timing chart showing the operation of the write & auto-refresh controller in FIG. 17.

FIG. 17 illustrates a practical example of a write & auto-refresh controller 84 for performing the control of this embodiment. FIG. 18 depicts the operating waveforms of the write & auto-refresh controller 84 shown in FIG. 17.

Compared to the write & auto-refresh controller 84 shown in FIG. 11, the write & auto-refresh controller 84 of this embodiment is characterized in that the signal bCOLAC-TRU is input to a latch & enable circuit. This signal bCOLACTRU maintains level "L" for a half period of a clock CLK when the first command "RDA" is detected. Also, the latch & enable circuit has a function of forcedly changing the write control signal REFWRT to level "L" while the signal bCOLACTRU is at level "L".

The operation of this write & auto-refresh controller 84 shown in FIG. 17 will be briefly described below with reference to the waveforms in FIG. 18.

When an auto-refresh cycle starts, the write control signal REFWRT is set at level "H". When a read cycle begins after that, the signal bCOLACTRU changes to level "L", and the write control signal REFWRT temporarily changes to level "L" in response to that. This allows row circuits to become active, and a selected word line is activated when a bank signal BNK changes to level "H".

The activation timing of column circuits can be later than that of the row circuits. Therefore, the column circuits can be rendered active after a second command is received. That is, a read operation is controlled by using a signal bCOLACTR which maintains level "L" for a half period of the clock CLK when a second command "LAL" is detected. More specifically, the column circuits can be rendered active when this signal bCOLACTR changes to level "L".

The control method as explained above makes a read operation possible even while the write control signal REFWRT maintains level "H".

In the synchronous semiconductor system of the present invention, when a "Late Write" type data write system is applied to an FCRAM, unnecessary row access can be omitted in the second and later cycles of successive auto-refresh cycles. Consequently, it is possible to reduce the current consumption during auto-refresh, improve the reliability of memory cells, and increase the margin of the refresh cycle time tREFC.

(6) Fourth Embodiment

Next, a fourth embodiment of the present invention will be described. In this embodiment, three characteristics, i.e., a first characteristic, a second characteristic, and a third characteristic will be described.

The embodiment is applied to, for example, a fast cycle RAM shown in FIG. 10. In explanation for each characteristic, the outline thereof will be described first, and then an example of a system (circuit example) and an operation waveform will be described.

(6)-1 First Characteristic

[I] Outline

Figure 19:
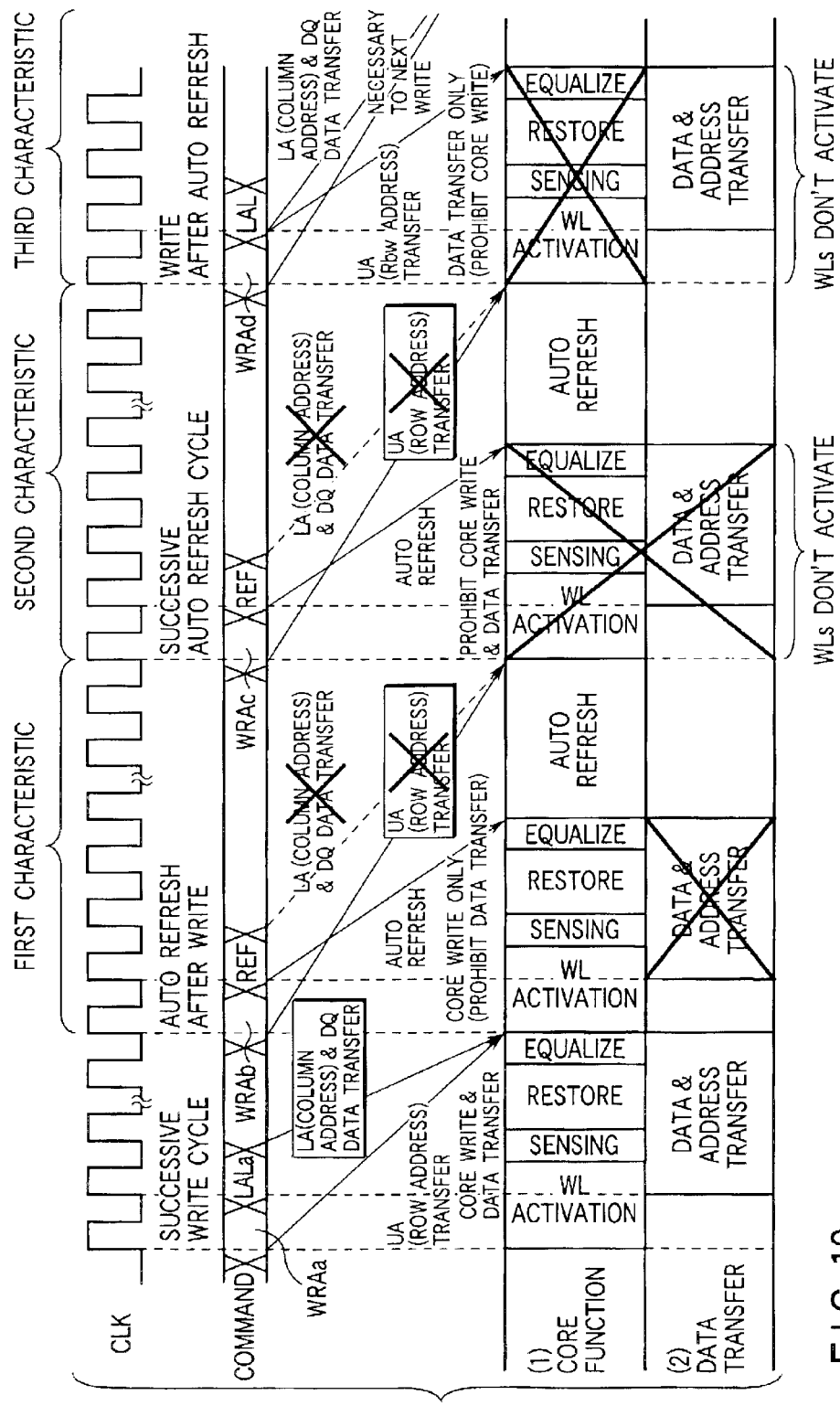
FIG. 19 is a timing diagram showing the outline of the present invention.

FIG. 19 shows an outline of an operation (operation waveform) which is executed when a plurality of auto-refresh cycles are performed sequentially after a write cycle in the fast cycle RAM in FIG. 10, and finally the write cycle is performed.

The fast cycle RAM employs a late write system. That is, write data are written in a selected memory cell through two write cycles.

In the first write cycle, a row address signal is recorded in a row address register, a column address signal is recorded in a column address register, and the write data are recorded in a data register. (Data load operation) In the second write cycle, a row decoder is activated so that the row address signal in the row address register is transferred to the row decoder, and a column decoder is activated so that the column address signal in the column address register is transferred to the column decoder, and further, the write data in the data register are written in a selected memory cell. (Write operation)

If a single write cycle is taken up, a bank (row decoder and column decoder) is activated, and a write operation, in which the write data are written in a selected memory cell that has been selected by the row/column address signals, and a data load operation in which write data and row/column address signals are recorded in registers, are performed in parallel.

During the write cycles are being performed by the late write system of this kind, the first characteristic is in an operation at the time when the auto-refresh cycle is inserted in the write cycles, more specifically, in an auto-refresh cycle immediately after the write cycle.

In this embodiment (in FIG. 19), an operation in which sequential plural auto-refresh cycles are inserted in the write cycles is shown.

In the first auto-refresh cycle after the write cycle, firstly, the write data recorded in the data register by the write cycle immediately before the auto-refresh cycle are written in a memory cell that is selected by the row/column address signals recorded in the row/column address registers. That is, in the first auto-refresh cycle, a WRAb as a first command is detected, and immediately after that, a write operation (Core write: WL Activation→Sensing→Restore→Equalize) is executed. Thus, the data writing in the write cycle immediately before the auto-refresh cycle is completed.

Note that, this cycle is the auto-refresh cycle. Therefore, a data load operation (Data & Address Transfer), in which write data and row/column address signals are recorded in the registers, is not executed.

That is, if a LAL is detected as a second command, this cycle becomes a write cycle, so that the Data and Address Transfer is executed. However, a REF is detected as a second command, this cycle becomes the auto-refresh cycle, so that the Data and Address Transfer is prohibited. In addition, this cycle is the auto-refresh cycle, the auto refresh operation is executed after the completion of the write operation (Core Write: WL Activation→Sensing→Restore→Equalize).

As described above, according to the first characteristic, at the time when the write cycles are being executed by the late write system, the write data recorded in the data register in the write cycle immediately before the auto-refresh cycle are written in the memory cell in the first auto-refresh cycle after the write cycle, while the data load operation, in which the write data and row/column address signals are recorded in the registers, is not executed. Therefore, the write cycle can be changed to the auto-refresh cycle smoothly under the late write system.

[II] Example of Address/Data Control System (Circuit Example)

Figure 20:
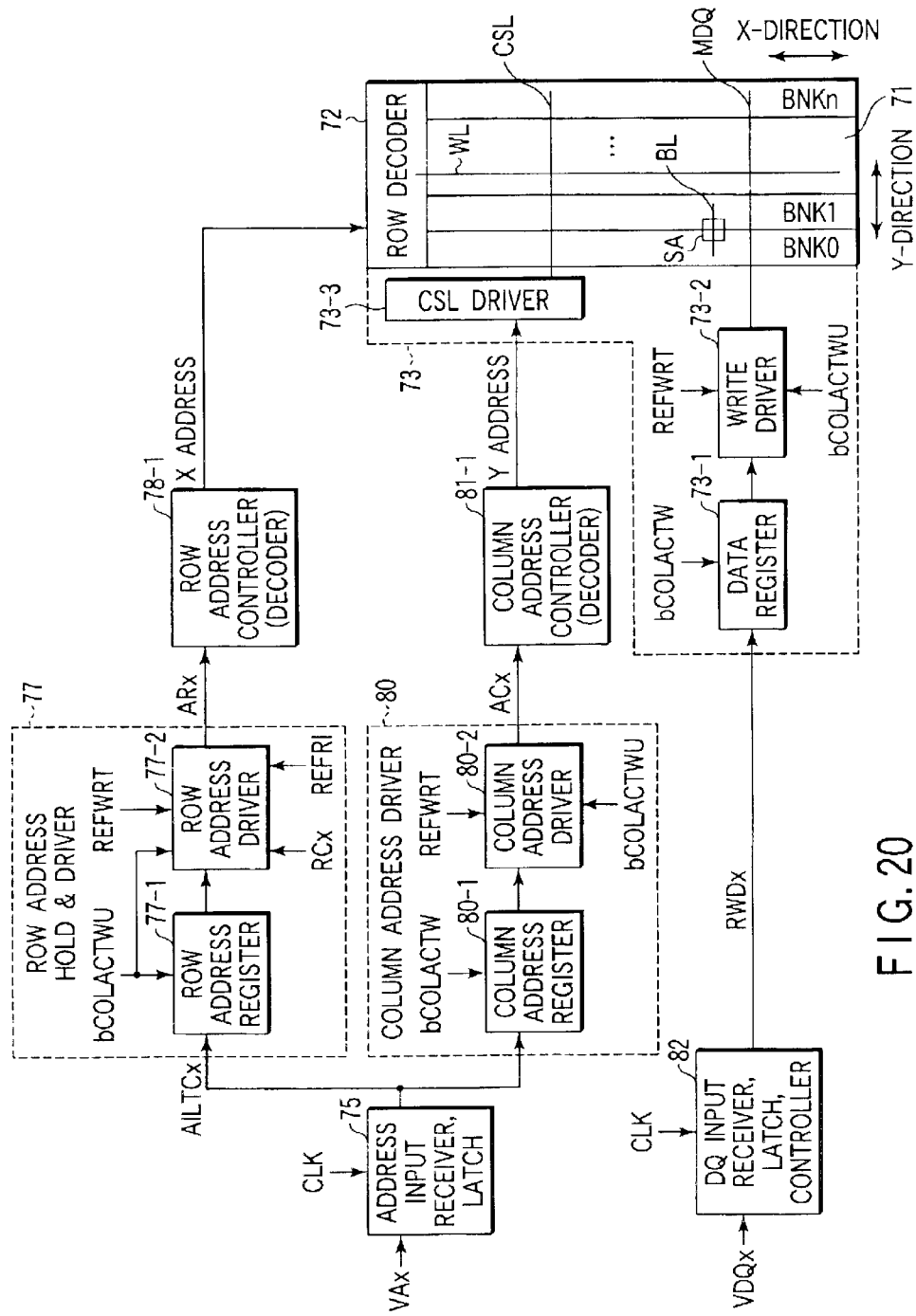
FIG. 20 is a block diagram showing an example of an address/data control system according to the invention.

FIG. 20 shows an example of an address/data control system for realizing the operation (Outline) in FIG. 19.

In FIG. 20, only a main portion of the fast cycle RAM shown in FIG. 10 is indicated, and the constituting elements corresponding to ones in FIG. 10 are indicated with the same symbols. However, FIG. 20 shows a specific portion of the fast cycle RAM according to the invention in detail, and thus, elements not shown in FIG. 10 are also included therein.

A memory cell array 71 is constituted of number n+1 of bank BNK 0, BNK 1, . . . BNKn, which are arranged in a Y-direction, for example. Each bank has plural memory cells arranged in an array form. In addition, each bank has a bit line BL, and the bit line BL is connected to a sense amplifier SA. The sense amplifier SA is connected to a DQ line (Data line) MDQ, which is extending to the Y-direction, via a column selection switch. The DQ line MDQ is shared by the number n+1 of bank BNK0, BNK1, . . . BNKn. The column selection switch is connected to a column selection line CSL extending to the Y-direction. A word line WL extends to the X-direction.

An address signal VAx is input into an address input receiver 75, which works in synchronization with a clock signal CLK. A row address signal is input into a row address register 77-1, and a column address signal is input into a column address register 80-1.

The row address register 77-1 is controlled by a control signal bCOLACTWU. The control signal bCOLACTWU is a signal staying "L" for a certain period, if the first command is a WRA (Write cycle and auto-refresh cycle). When the control signal bCOLACTWU is to be "L", the row address register 77-1 records a row address signal supplied from an outside of a chip. (data load) The row address signal recorded in the row address register 77-1 is supplied to a row address driver 77-2. The row address driver 77-2 is controlled by the control signal bCOLACTWU, REFWRT, and REFRI.

The control signal bCOLACTWU is a signal staying "L" in a certain period if the first command is the WRA (Write cycle and auto-refresh cycle), as described above. The control signal REFWRT becomes "L" after detecting the LAL (write cycle) as the second command, or the control signal REFWRT is a signal that maintains "L", and becomes "H" after detecting the REF (auto-refresh cycle) as the second command, or a signal that maintains "H".

In the case where the control signal REFWRT is "L", when the control signal bCOLACTWU is to be "L", the row address driver 77-2 is activated and it outputs a row address signal ARx to a row address controller (decoder) 78-1. The row address controller (decoder) 78-1 supplies a row address signal XAddress to a row decoder 72. The row decoder 72 is activated when the control signal bWLON (see FIG. 21) is "L", and drives the word line WL in accordance with the row address signal XAddress.

In the case where the control signal REFWRT is "H", the row address driver 77-2 becomes in a non-operation state (non-activation), the row address signal ARx is not supplied to a row address controller (decoder) 78-1, in principle.

However, even if the control signal REFWRT is "H", the control signal (refresh operation detection signal) REFRI stays in "H". In this case, the row address driver 77-2 is activated. In this case, the row address controller (decoder) 78-1 is supplied with a refresh counter address signal RCx generated by a refresh address counter (see FIG. 10) as the row address signal ARx, but not a row address signal recorded in the row address register 77-1.

A column address register 80-1 is controlled by the control signal bCOLACTW. The control signal bCOLACTW is a signal staying in "L" for a certain period when the second command is the LAL (write cycle). When the control signal bCOLACTW is to be "L", the column address register 80-1 records a column address signal supplied from the outside of the chip.

The column address signal recorded in the column address register 80-1 is supplied to a column address driver 80-2. The column address driver 80-2 is controlled by the control signal bCOLACTWU, and the REFWRT.

Here, the column address driver 80-2 may comprise a counter function. That is, a part of the column address signal, for example, low 2-bits may be generated by the counter. (The element corresponding to the column address driver 80-2 denotes a counter in FIG. 10.)

The control signal bCOLACTWU is a signal becoming "L" for a certain period if the first command is the WRA (write cycle and auto-refresh cycle). The control signal REFWRT becomes "L" after detection of the LAL (write cycle) as the second command, or the control signal REFWRT is a signal maintaining "L" and becomes "H" after detecting the REF (auto-refresh cycle) as the second command, or a signal that maintains "H".

In the case where the control signal REFWRT is in the "L" state, when the control signal bCOLACTWU is to be "L", the column address driver 80-2 is activated and it outputs a column address signal ACx to a column address controller (decoder) 81-1. The column address controller (decoder) 81-1 supplies a column address signal YAddress to a CSL driver 73-3. The CSL driver 73-3 is activated during the period when a control signal bFCSLE (see FIG. 21) is "L", and it drives a column selection line CSL in accordance with the column address signal YAddress.

In the case where the control signal REFWRT is "H", the column address driver 80-2 becomes in a non-operation state (non-activation), and thus the column address signal ACx is not supplied to the column address controller (decoder) 81-1.

A write data VDQx is input into a data register 73-1 via a DQ input receiver 82 that works in synchronization with the clock signal CLK and a read/write data line RWDx. The data register 73-1 is controlled by the control signal bCOLACTW. The control signal bCOLACTW is a signal that becomes "L" for a certain period when the second command is the LAL (write cycle). When the control signal bCOLACTW is to be "L", the data register 73-1 records the write data.

The write data recorded in the data register 73-1 are supplied to a write driver 73-2. The write driver 73-2 is controlled by the control signal bCOLACTWU, and the REFWRT.

In the case where the control signal REFWRT is "L", when the control signal bCOLACTWU is to be "L", the write driver 73-2 is activated and it transfers the write data to the DQ line MDQ. In the case where the control signal REFWRT is "H", the write driver 73-2 becomes in a non-operation state (non-activation), and thus the write data are not transferred to the DQ line MDQ.

[III] Operation 1

An operation of the address/data control system shown in FIG. 20 will be described.

Figure 22:
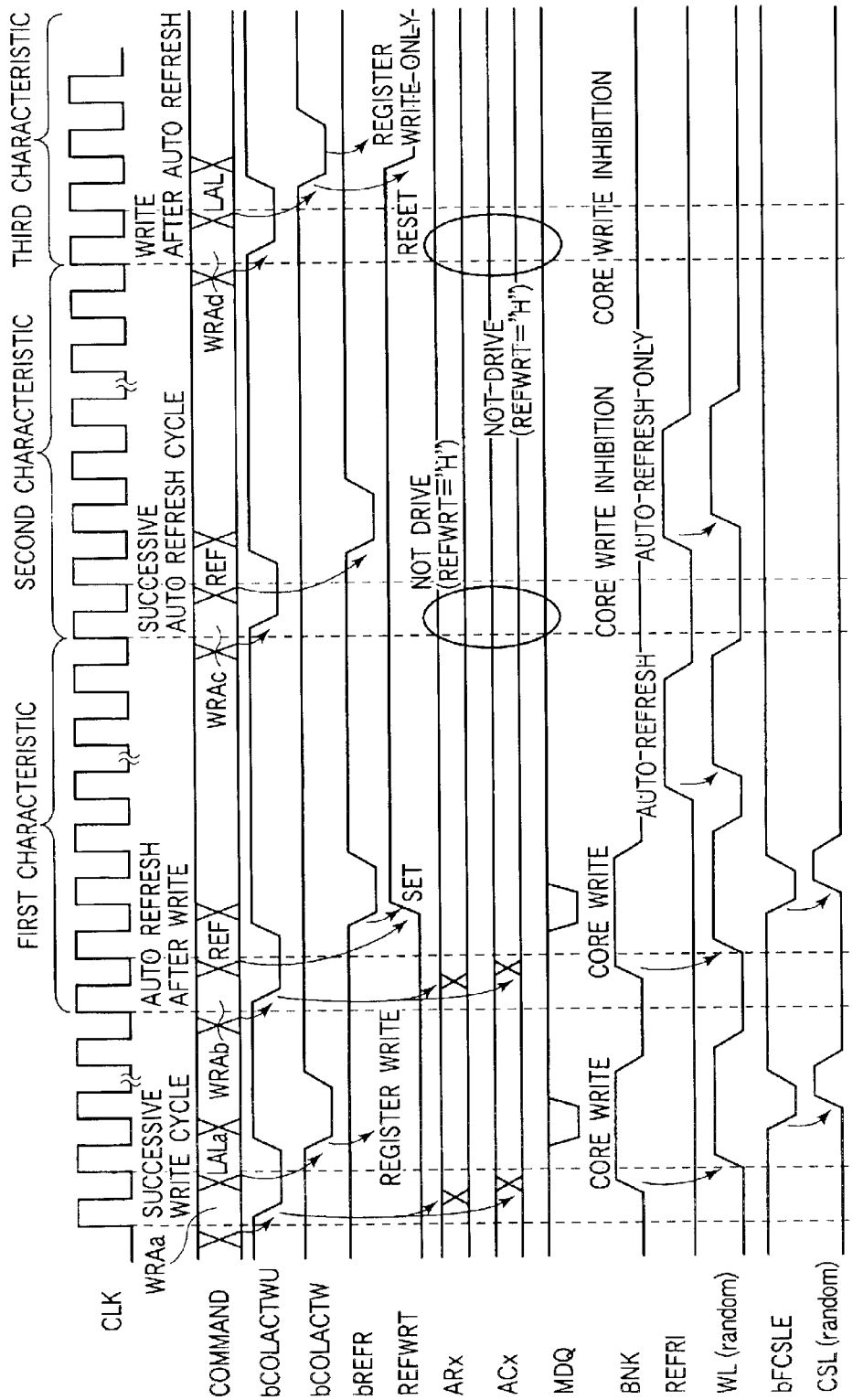
FIG. 22 is a waveform diagram showing an example of an operation of a fast cycle RAM according to the invention.

FIG. 22 shows an operation waveform of the fast cycle RAM according to the invention.

The first characteristic relates to the first auto-refresh cycle after the write cycle.

Write Cycle Immediately before the Auto-Refresh Cycle

In the write cycle immediately before the auto-refresh cycle, when a first command WRA is detected, the control signal bCOLACTWU becomes "L". Therefore, an access operation is performed with use of a row/column address signals in the registers 77-1 and 80-1, so that writing operation to the selected memory cell is executed with use of the write data in the register 73-1. (Core Write: BNK= "H") In addition, a new row address signal is recorded in a row address register 77-1.

When the second command LAL is detected, the control signal bCOLACTW becomes "L". Therefore, a new column address signal is recorded in the column address register 80-1, and new write data are recorded in the data register 73-1. (register write)

The First Auto-Refresh Cycle after the Write Cycle

As for the first auto-refresh cycle after the write cycle, when the first command WRA is detected, the control signal bCOLACTW becomes "L". In this stage, the control signal REFWRT is in the "L" state. Therefore, an access operation is performed by row/column address signals in the registers 77-1 and 80-1, so that write operation to the selected memory cell is executed with use of the write data on the register 73-1. (Core Write: BNK="H") In addition, a new row address signal is recorded in the row address register 77-1.

In this embodiment, the row address signal is taken into the row address register 77-1 in accordance with the control signal bCOLACTWU. Therefore, in the auto-refresh cycle, the row address signal is also taken into the row address register 77-1. However, this row address signal is not used as shown in the second and third characteristics described later, so that no problem occurs for the operation.

When the second command REF is detected, the control signal bREFR becomes "L". Thus, the control signal REFWRT is set to "H" by a write & auto refresh controller 84 (see FIG. 10). (Set) On the other hand, when the control signal bREFR becomes "L", an auto refresh circuit 85 (see FIG. 10) is activated. Then, the auto refresh circuit 85 turns the control signal REFRI into "H" for a certain period after the completion of the write operation (Core Write). On receiving the control signal REFRI (="H"), a refresh operation is executed.

In the refresh operation, a row address driver 77-2 selects a refresh counter address signal RCx under the control of the control signal REFRI, and outputs the selected signal as a row address signal ARx. Therefore, no crucial influence occurs due to the row address signal recorded in the row address register 77-1.

When the second command REF is detected, the control signal bCOLACTW maintains the state "H". Thus, a new column address signal is not recorded in a column address register 80-1, and new write data are not recorded in the data register 73-1.

As described above, according to the first characteristic, it is configured in that, in the auto-refresh cycle immediately after the write cycle, the first command WRA is detected, and immediately after that, a write operation is executed with use of the row address signals, column address signals and write data. As a result, in the auto-refresh cycle, the write data that have been taken into the register in the write cycle immediately before the auto-refresh cycle can be stored in a predetermined address. In addition, it is configured in that, when the second command REF is detected, at least the column address signals and write data are not taken into the registers 73-1 and 80-1. Therefore, the write cycle in the late write system can be changed over to the auto-refresh cycle smoothly.

In addition, when the second command REF is detected, the control signal REFWRT is set to "H". When the control signal REFWRT is in the "H" state, at least the column address driver 80-2 and write driver 73-2 are set to the non-operation state. Therefore, no operational inconvenience occurs in the cycle that is performed after the auto-refresh cycle.

Note that, the case where the cycle to be performed after the auto-refresh cycle is the auto-refresh cycle will be described in detail in the second characteristic to be described later. In addition, the case where the cycle to be performed after the auto-refresh cycle is the write cycle will be described in detail in the third characteristic to be described later.

Further, even if the second command REF has been detected and the control signal REFWRT has been set to the "H" state, the row address driver 77-2 is set in the operation state by the control signal REFRI and the driver supplies the refresh counter address signal RCx to a row address controller (decoder) 78-1 as the row address signal ARx. Therefore, a refresh operation can be performed steadily.

[IV] Example of Row/Column Control System (Circuit Example)

FIG. 21 shows an example of the row/column control system for realizing the operation (Outline) in FIG. 19.

FIG. 21 shows a main portion of the fast cycle RAM shown in FIG. 10, and elements corresponding to ones in FIG. 10 are indicated with the same symbols as FIG. 10. However, FIG. 21 shows a specific portion of the fast cycle RAM according to the invention in detail, so that elements not shown in FIG. 10 are included therein.

A command input receiver 74 generates control signals bCOLACTWU, bCOLACTW, and bREFR in accordance with command data VBCS and VFN.

The control signal bCOLACTWU is a signal that becomes "L" for a certain period when the first command is the WRA (write cycle and auto-refresh cycle). The control signal bCOLACTW is a signal that becomes "L" for a certain period when the second command is the LAL (write cycle). The control signal bREFR is a signal that becomes "L" for a certain period when the second command is the REF (auto-refresh cycle).

A row active controller 76 becomes in an operation state when the control signal REFWRT is "L", and becomes a non-operation state when the control signal REFWRT is "H". When the control signal REFWRT is "L", the row active controller 76 receives a falling edge ("H"→"L") of the control signal bCOLACTWU, and outputs the control signal BNK (="H") for a certain period, for example. A WL active controller 78-2 outputs a control signal bWLON (="L"), when the control signal BNK is "H". When the control signal bWLON becomes "L", the row decoder 72 is activated.

When the control signal REFWRT is "H", the control signal BNK is always in the state of "L". At this time, the WL active controller 78-2 turns the control signal bWLON into "H", in principle. However, the WL active controller 78-2 turns the control signal bWLON into "L", when the control signal (refresh operation detection signal) REFRI is "H".

A column active controller 79 becomes an operation state when the control signal BNK is "H", and the controller 79 becomes a non-operation state when the control signal BNK is "L". When the control signal BNK is "H", the column active controller 79 receives a falling edge ("H"→"L") of the control signal bCOLACTW or a falling edge ("H"→"L") of the control signal REFR so as to output a control signal CSLCK (="H") for a certain period.

For example, when the LAL (write cycle) is detected as the second command, the control signal bCOLACTW changes from "H" to "L". Therefore, if the control signal BNK is "H", the column active controller 79 outputs the control signal CSLCK (="H") for a certain period. When the REF (auto-refresh cycle) is detected as the second command, the control signal bREFR changes from "H" to "L". Therefore, when the control signal BNK is "H", the column active controller 79 outputs the control signal CSLCK (="H") for a certain period.

A CSL controller 81-2 turns a control signal bFCSLE into "L" when the control signal CSLCK is "H". When the control signal bFCSLE becomes "L", a DQ buffer (driver) &

CSL driver 73 is activated. In addition, when the control signal BNK is "L", the control signal CSLCK always becomes "L" regardless of the control signal bCOLACTW and the bREFR.

[V] Operation 2

An operation of the row/column control system shown in FIG. 21 will be described.

FIG. 22 shows an operation waveform of the fast cycle RAM according to the invention.

The first characteristic relates to the first auto-refresh cycle after the write cycle.

Write Cycle Immediately before the Auto-Refresh Cycle

As for the write cycle immediately before the auto-refresh cycle, when the first command WRA is detected, the control signal bCOLACTWU becomes "L". Therefore, the row active controller 76 turns the control signal BNK into "H" for a certain period. During the period when the control signal BNK is "H", the WL active controller 78-2 turns the control signal bWLON into "L". Therefore, the row decoder 72 is activated and a row access operation is executed.

When the second command LAL is detected, the control signal bCOLACTW becomes "L". Therefore, the column active controller 79 turns the control signal CSLCK into "H" for a certain period. During the period when the control signal CSLCK is "H", a CSL controller 81-2 turns the control signal bFCSLE into "L", so that the DQ buffer (driver) & CSL driver 73 is activated, thereby executing a column access operation.

The First Auto-Refresh Cycle after Write Cycle

As for the first auto-refresh cycle after the write cycle, when the first command WRA is detected, the control signal bCOLACTWU becomes "L". In this stage, the control signal REFWRT is in the "L" state. Accordingly, the row active controller 76 turns the control signal BNK into "H" for a certain period. During the period when the control signal BNK is "H", the WL active controller 78-2 turns the control signal bWLON into "L". Therefore, the row decoder 72 is activated, thereby executing a row access operation.

When the second command REF is detected, the control signal bREFR becomes "L". Therefore, the column active controller 79 turns the control signal CSLCK into "H" for a certain period. During the period when the control signal CSLCK is "H", the CSL controller 81-2 turns the control signal bFCSLE into "L", so that the DQ buffer (driver) & CSL driver 73 is activated, thereby executing a column access operation.

Incidentally, when the second command REF is detected, the control signal bREFR becomes "L". Therefore, the control signal REFWRT is set to "H" by a write & auto refresh controller 84 (see FIG. 10). On the other hand, when the control signal bREFR becomes "L", an auto refresh circuit 85 (see FIG. 10) is activated. Then the auto refresh circuit 85 turns the control signal REFRI into "H" for a certain period after the completion of the write operation (Core Write). On receiving the control signal REFRI (="H"), a refresh operation is executed.

During the period of the refresh operation, the REFWRT is "H", and the control signal BNK is "L". Therefore, the column active controller 79 is always in the state in that the controller 79 outputs the control signal CSLCK (="L") regardless of the control signal bCOLACTW and bREFR. Thus, a column access operation is not executed. In addition, the control signal BNK is "L", but the control signal REFRI is "H". Therefore, during the period when the control signal REFRI is "H", the control signal bWLON becomes "L", so that a row access operation for a refresh operation is executed.

As described above, according to the first characteristic, in the auto-refresh cycle immediately after the write cycle, the row decoder 72 and DQ buffer & CSL driver 73 are activated so as to execute a write operation immediately after the detection of the first command WRA. Therefore, in the auto-refresh cycle, the write data taken in the register can be stored in a predetermined address in the write cycle immediately before the auto-refresh cycle.

In addition, when the second command REF is detected, the control signal REFWRT is set to "H". When the control signal REFWRT is "H", the control signal BNK is set to "L", so that the DQ buffer & CSL driver 73 is configured not to be activated. Thus, no operational inconvenience occurs in the cycle that is performed after the auto-refresh cycle.

Note that, the case where the cycle to be performed after the auto-refresh cycle is a auto-refresh cycle will be described in detail in the second characteristic to be described later. In addition, the case where the cycle to be performed after the auto-refresh cycle is a write cycle will be described in detail in the third characteristic to be described later.

Further, even after the fact that when the second command REF is detected and the control signal REFWRT is set to "H", a row access operation in the auto-refresh cycle can be performed by making the row decoder 72 to be in an operational state with use of the control signal REFRI.

[VI] Summary

According to the first characteristic, as for the auto-refresh cycle, in the case where the auto-refresh cycle is performed immediately after the write cycle, a write operation of the write data taken into a chip in the write cycle immediately before the auto-refresh cycle is firstly executed. In addition, in this auto-refresh cycle, the column address signal and write data are not taken into at least a chip, which makes the late write system effective. Further, with use of the auto-refresh detection signal REFRI, the auto-refresh cycle can be automatically started after the completion of the core write.

(6)-2 Second Characteristic

[I] Outline

FIG. 19 shows an outline (operation waveform) of an operation in the case where plural auto-refresh cycles are sequentially performed after the write cycle in the fast cycle RAM shown in FIG. 10, and finally the write cycle is performed.

The fast cycle RAM employs the late write system. That is, the write data are written into the selected memory cell by two write cycles. In addition, the late write system has been described in the [I] Outline of the "FIRST CHARACTERISTIC", so that the description for that is omitted herein.

The second characteristic is seen in an operation of inserting sequential plural auto-refresh cycles in the write cycles when the write cycles are being executed by the late write system of this kind, more specifically, the characteristic is seen in the second auto-refresh cycle among the auto-refresh cycles or the later auto-refresh cycles.

In the first characteristic, a write operation, in which the write data recorded in the data register in the write cycle immediately before the auto-refresh cycle are written in a memory cell to be selected by the row/column address signals recorded in the row/column address registers, is firstly performed in the first auto-refresh cycle after the write cycle.

In addition, in the first auto-refresh cycle, new write data are not transferred to the data register. Similarly, a new column address signal is not transferred to the column address register. In the first characteristic, as described above, the column address signal and write data are prohibited from being loaded in the first auto-refresh cycle, and further the auto-refresh cycle is executed after the completion of the aforementioned write operation.

In the case where plural auto-refresh cycles are performed sequentially after the first auto-refresh cycle, it is not necessary for the second or the later auto-refresh cycles to be performed with the write operation based on the late write system and a data load operation (data & address transfer). On the contrary, if the write operation is performed in the second or the later auto-refresh cycles, unnecessary data are written in the memory cell randomly, which causes what is called data crash.

In the second characteristic, in the case where sequential plural auto-refresh cycles are performed, the write operation (Core Write: WL Activation→Sensing→Restore→Equalize) based on the late write system and the data load operation (data & address transfer) are not executed. That is, in the second or the later auto-refresh cycles, only the auto-refresh operation is performed.

As described above, according to the second characteristic, in the case where sequential plural auto-refresh cycles are inserted into the write cycles by the late write system, the write operation and data load operation (data & address transfer) are prohibited in the second or the later auto-refresh cycles after the write cycle. Therefore, in the fast cycle RAM applied with the late write system, the auto-refresh operation can be executed without any data crash.

[II] Example of Address/Data Control System (Circuit Example)

FIG. 20 shows an example of the address/data control system for realizing the operation (Outline) in FIG. 19.

FIG. 20 shows only a main portion of the fast cycle RAM shown in FIG. 10. In FIG. 20, elements corresponding to ones in FIG. 10 are indicated with the same symbols as ones in FIG. 10. However, FIG. 20 shows the specific portions of the fast cycle RAM according to the invention in detail, so that elements not shown in FIG. 10 are also included therein.

As for the address/data control system shown in FIG. 20, the description is omitted because it has been described in the "[II] Example of address/data control system" in the "FIRST CHARACTERISTIC" in detail.

[III] Operation 1

An operation of the address/data control system shown in FIG. 20 will be described.

FIG. 22 shows an operation waveform of the fast cycle RAM according to the invention.

The second characteristic relates to the second or the later auto-refresh cycles after the write cycle.

The First Auto-Refresh Cycle after Write Cycle

In the first auto-refresh cycle after write cycle, when the first command WRA is detected, the control signal bCOLACTWU becomes "L". In this stage, the control signal REFWRT is in the "L" state. Therefore, an access operation is performed through the row/column address signals in the registers 77-1 and 80-1, and a write operation with use of the write data in the register 73-1 is executed to the selected memory cell. (Core Write: BNK="H") In addition, a new row address signal is recorded in the row address register 77-1.

In this embodiment, the row address signal is taken into the row address register 77-1 in accordance with the control signal bCOLACTWU. Therefore, in the auto-refresh cycle, the row address signal is also taken into the row address register 77-1.

When the second command REF is detected, the control signal bREFR becomes "L". Therefore, the control signal REFWRT is set to "H" by the write & auto refresh controller 84 (see FIG. 10). When the control signal bREFR becomes "L", the auto refresh circuit 85 (see FIG. 10) is activated. Then, the circuit 85 turns the control signal REFRI into "H" for a certain period after the completion of the write operation (Core Write). On receiving the control signal REFRI (="H"), a refresh operation is executed.

In the refresh operation, the row address driver 77-2 selects a refresh counter address signal RCx under the control of the control signal REFRI, and outputs the selected signal as the row address signal ARx. Thus, the row address signal recorded in the row address register 77-1 makes no crucial influence.

In addition, when the second command REF is detected, the control signal bCOLACTW maintains "H", so that a new column address signal is not recorded in the column address register 80-1. Also, new write data are not recorded in the data register 73-1.

The Second Auto-Refresh Cycle after the First Auto-Refresh Cycle

In the second auto-refresh cycle after the first auto-refresh cycle, when the first command WRA is detected, the control signal bCOLACTWU becomes "L". However, in this stage, the control signal REFWRT is in the state of "H" (see the first auto-refresh cycle), an access operation with use of the row/column address signal in the registers 77-1 and 80-1 and a write operation with use of the write data in the register 73-1 are not executed. (Core Write inhibition: BNK="L") However, the row address signal is transferred to the row address register 77-1.

In the second auto-refresh cycle, when the second command REF is detected, the control signal bREFR becomes "L". Therefore, the "H" is maintained as a value of the control signal REFWRT by the write & auto refresh controller 84 (see FIG. 10). When the control signal bREFR becomes "L", the auto refresh circuit 85 (see FIG. 10) is activated. Then, the circuit 85 turns the control signal REFRI into "H" for a certain period. On receiving the control signal REFRI (="H"), a refresh operation is executed.

In the refresh operation, the row address driver 77-2 selects the refresh counter address signal RCx under the control of the control signal REFRI, and outputs the selected signal as the row address signal ARx. Therefore, a row access operation is executed for the refresh operation. At this time, the row address signal recorded in the row address register 77-1 makes no crucial influence on the refresh operation.

In addition, when the second command REF is detected, the control signal bCOLACTW maintains "H", so that a new column address signal is not recorded in the column address register 80-1, and further, no new write data are recorded in the data register 73-1.

As described above, according to the second characteristic, in the case where sequential plural auto-refresh cycles are inserted into the write cycle by the late write system, the control signal REFWRT maintains "H" in the second or the later auto-refresh cycles after the write cycle, and the column address driver 80-2 and write driver 73-2 are stayed in a non-operational state. Therefore, a write operation is not executed, and thus no data crash occurs.

In the auto-refresh cycle, when the second command REF is detected, the control signal bCOLACTW maintains "H". Therefore, both the column address register 80-1 and data register 73-1 are in a non-operational state, and the column address signal and writing data are inhibited from being loaded (data & address transfer).

Further, even after the fact that the second command REF is detected and the control signal REFWRT is set to "H", the row address driver 77-2 is turned into an operational state by the control signal REFRI, and the driver 77-2 supplies the refresh counter address signal RCx to the row address controller (decoder) 78-1 as the row address signal ARx. Therefore, the refresh operation can be performed.

[IV] Example of Row/Column Control System (Circuit Example)

FIG. 21 shows an example of the row/column control system for realizing the operation (Outline) shown in FIG. 19.

FIG. 21 shows only the main portion of the fast cycle RAM shown in FIG. 10. In FIG. 21, elements corresponding to ones in FIG. 10 are indicated with the same symbols as ones in FIG. 10. However, FIG. 21 shows the specific portions of the fast cycle RAM according to the invention in detail, so that elements not shown in FIG. 10 are also included therein.

As for the row/column control system shown in FIG. 21, the description is given in the "first characteristic" of the "[IV] Example of row/column control system" in detail, so that its description will be omitted herein.

[V] Operation 2

An operation of the row/column control system shown in FIG. 21 will be described.

FIG. 22 shows an operation waveform of the fast cycle RAM according to the invention.

The second characteristic relates to the second or the later auto-refresh cycles after the write cycle.

The First Auto-Refresh Cycle after Write Cycle

In the first auto-refresh cycle after write cycle, when the first command WRA is detected, the control signal bCOLACTWU becomes "L". In this stage, the control signal REFWRT is in the state of "L". Therefore, the row active controller 76 turns the control signal BNK into "H" for a certain period. During the period when the control signal BNK is "H", the WL active controller 78-2 turns the control signal bWLON into "L", so that the row decoder 72 is activated, thereby executing the row access operation.

When the second command REF is detected, the control signal bREFR becomes "L". Therefore, the column active controller 79 turns the control signal CSLCK into "H" for a certain period. During the period when the control signal CSLCK is "H", the CSL controller 81-2 turns the control signal bFCSLE into "L". Therefore, the DQ buffer (driver) & CSL driver 73 is activated, thereby executing the column access operation.

Incidentally, when the second command REF is detected, the control signal bREFR becomes "L". Therefore, the control signal REFWRT is set to "H" by the write & auto refresh controller 84 (see FIG. 10). In addition, when the control signal bREFR becomes "L", the auto refresh circuit 85 (see FIG. 10) is activated, and then the circuit 85 turns the control signal REFRI into "H" for a certain period after the completion of the write operation (Core Write). On receiving the control signal REFRI (="H"), the refresh operation is executed.

During the period of the refresh operation, the REFWRT is in the state of "H"; and the control signal BNK, "L". Therefore, the column active controller 79 is in the status in which the controller 79 always outputs the control signal CSLCK (="L") regardless of the control signal bCOLACTW and bREFR. Thus, the column access operation is not performed. On the other hand, the control signal BNK is in the state of "L", however, the control signal REFRI is "H", so that the control signal bWLON becomes "L" during the period when the control signal REFRI is "H". Thus, the row access operation for the refresh operation is executed.

The Second Auto-Refresh Cycle after the First Auto-Refresh Cycle

In the second auto-refresh cycle after the first auto-refresh cycle, when the first command WRA is detected, the control signal bCOLACTWU becomes "L". However, in this stage, the control signal REFWRT is in the state of "H". Therefore, the row active controller 76 is in a non-operational state, and the control signal BNK is always in the state of "L". (Core Write inhibition)

When the second command REF is detected, the control signal bREFR becomes "L". However, in this stage, the control signal REFWRT is in the state of "H", and the control signal BNK is in the "L". Therefore, the column active controller 79 is in a non-operational state, and the control signal CSLCK is always in the state of "L". Accordingly, since the CSL controller 81-2 turns the control signal bFCSLE into "H", the DQ buffer (driver) & CSL driver 73 is not activated, thereby prohibiting the column access operation.

Incidentally, when the second command REF is detected, the control signal bREFR becomes "L". So, the write & auto refresh controller 84 (see FIG. 10) causes the control signal REFWRT to maintain "H", and the auto refresh circuit 85 (see FIG. 10) is activated so as to turn the control signal REFRI into "H" for a certain period. On receiving the control signal REFRI (="H"), the refresh operation is executed.

During the period of the refresh operation, the REFWRT is in the state of "H"; the control signal BNK, "L". Therefore, the column active controller 79 is in the state where the controller 79 always outputs the control signal CSLCK (="L") regardless of the control signal bCOLACTW and bREFR. Thus, as described above, the column access operation is not performed. On the other hand, the control signal BNK is in the state of "L", however, the control signal REFRI becomes "H". Therefore, the control signal bWLON becomes "L" during the period when the control signal REFRI is "H", thereby executing the row access operation for the refresh operation.

As described above, according to the second characteristic, the row active controller 76 and column active controller 79 are set to the non-operation state in the second or the later auto-refresh cycles in the case where sequential plural auto-refresh cycles immediately after the write cycle are executed with use of the control signal REFWRT. In addition, with use of the control signal REFRI, the WL active controller 78-2 is turned into an operation state, and the row decoder 72 is also turned into the operation state. Accordingly, the write operation (core write) for the late write system and the data load operation (data & address transfer) are prohibited in the second or the later auto-refresh cycle, thereby executing only the refresh operation.

[VI] Summary

According to the second characteristic, in the case where the sequential plural auto-refresh cycles immediately after the write cycle are preformed, the write operation (core write) for the late write system and the data load operation (data & address transfer) are not executed in the second or the later auto-refresh cycle with use of the control signal REFWRT. In addition, in the second or the later auto-refresh cycle, only the refresh operation can be performed automatically with use of the control signal REFRI.

(6)-3 Third Characteristic

[I] Outline

FIG. 19 shows the outline (operation waveform) of an operation that is performed when plural auto-refresh cycles are performed sequentially after the write cycle in the fast cycle RAM shown in FIG. 10, and then the write cycle performed finally.

The fast cycle RAM employs the late write system. That is, the write data are written in the selected memory cell by two write cycles. Note that, the late write system has been described in the "[I] Outline" of the "FIRST CHARACTERISTIC", so that the description for that is omitted herein.

The third characteristic is seen in a operation of inserting sequential plural auto-refresh cycles in the write cycle in the case where the write cycle is performed by the late write system, more specifically, in the write cycle immediately after the last auto-refresh cycle.

As for the late write system of the fast cycle RAM, as described in the second characteristic, the write operation and data load operation (data & address transfer) are prohibited in the second or the later auto-refresh cycle in the case where the sequential plural auto-refresh cycles immediately after the write cycle are executed.

Therefore, for example, in the write cycle immediately after the last auto-refresh cycle, the row and column address signals are not recorded in the row and column address registers, and further, the write data are not recorded in the data register.

Then, according to the third characteristic, in the first write cycle after the auto-refresh cycle, the write operation (Core Write: WL Activation→Sensing→Restore→Equalize) is prohibited, but only the data load operation (data & address transfer) is performed. If the write operation is performed in the first write cycle, unspecified data are written into a memory cell with an unspecified address, which causes a data crash.

As for the data load operation (data & address transfer), the row and column address signals are taken into the row and column address registers, and the write data are taken into the data register. Therefore, in the second or the later write cycles after the auto-refresh cycles, the write operation can be performed in the late write system as a normal operation.

[II] Example of Address/Data Control System (Circuit Example)

FIG. 20 shows an example of the address/data control system for realizing the operation (Outline) in FIG. 19.

FIG. 20 shows only the main portion of the fast cycle RAM in FIG. 10. In FIG. 20, elements corresponding to ones in FIG. 10 are indicated with the same symbols as ones in FIG. 10. However, FIG. 20 shows the specific portions of the fast cycle RAM according to the invention, so that elements not shown in FIG. 10 are also included therein.

As for the address/data control system shown in FIG. 20, its description has been described in detail in the "[II] Example of address/data control system" in the "FIRST CHARACTERISTIC" described above. Therefore, its description is omitted herein.

[III] Operation 1

An operation of the address/data control system shown in FIG. 20 will be described.

FIG. 22 shows an operation waveform for the fast cycle RAM according to the invention.

The third characteristic relates to the first write cycle after the auto-refresh cycle.

Auto-Refresh Cycle Immediately before the Write Cycle

In the auto-refresh cycle immediately before the write cycle, when the first command WRA is detected, the control signal bCOLACTWU becomes "L". In this stage, the control signal REFWRT is in the state of "H", and thus an access operation with use of the row/column address signals in the registers 77-1 and 80-1, and a write operation using the write data in the register 73-1 are not executed (Core Write inhibition BNK="L"). The row address signal is transferred to the row address register 77-1.

When the second command REF is detected, the control signal bREFR becomes "L". Therefore, the write and auto refresh controller 84 (see FIG. 10) maintains "H" as a value of the control signal REFWRT. In addition, when the control signal bREFR becomes "L", the auto refresh circuit 85 (see FIG. 10) is activated, and then the circuit 85 turns the control signal REFRI into "H" for a certain period. Then, on receiving the control signal REFRI (="H"), the refresh operation is performed.

In the refresh operation, the row address driver 77-2 selects the refresh counter address signal RCx under the control of the control signal REFRI, and outputs the selected signal as the row address signal ARx. When the second command REF is detected, the control signal bCOLACTW maintains "H". Therefore, no new column address signal is recorded in the column address register 80-1, and further, no new write data are recorded in the data register 73-1.

The First Write Cycle after the Auto-Refresh Cycle

In the first write cycle after the auto-refresh cycle, when the first command WRA is detected, the control signal bCOLACTWU becomes "L". However, in this stage, the control signal REFWRT maintains "H", so that the access operation using the row/column address signals in the registers 77-1 and 80-1, and the write operation using the write data in the register 73-1 are not executed (Core Write inhibition: BNK="L"). However, the row address signal is taken into the row address register 77-1.

When the second command LAL is detected, the control signal bCOLACTW becomes "L". Therefore, the value of the control signal REFWRT is set to "L" by the write & auto refresh controller 84 (see FIG. 10) (Reset). In addition, when the control signal bCOLACTW becomes "L", the column address register 80-1 and the data register 73-1 are activated. Accordingly, the column address signal is taken into the column address register 80-1, and the write data are taken into the data register 73-1 (register write).

As described above, according to the third characteristic, in the case where sequential plural auto-refresh cycles are inserted into the write cycles by the late write system, on receiving the control signal REFWRT (="H"), the column address driver 80-2 and write driver 73-2 are set in a non-operation state in the first write cycle after the auto-refresh cycle. In the write cycle, the control signal REFRI never becomes "H", so that the row address driver 77-2 is also in the non-operation state. Thus, the write operation is not executed, and no data crash occurs.

However, on receiving the detection of the first command WRA, the control signal bCOLACTWU becomes "L". Therefore, the row address signal is taken into the row address register 77-1. In addition, on receiving the detection of the second command LAL, the control signal bCOLACTW becomes "L". Therefore, the column address signal is taken into the column address register 80-1, and the write data are taken into the data register 73-1.

In the first write cycle after the auto-refresh cycle, on receiving the detection of the second command LAL, the control signal bCOLACTW becomes "L". Therefore, the control signal REFWRT is set to "L".

Accordingly, in the second or the later write cycles, which will be performed later, when the first command WRA is detected, the row/column access operation (write operation) and load operation of row address signal (row address transfer) are executed. When the second command LAL is detected, the load operation of the column address signal and the write data (column address & data transfer) is executed.

[IV] Example of Row/Column Control System (Circuit Example)

FIG. 21 shows an example of the row/column control system for realizing the operation (Outline) in FIG. 19.

FIG. 21 shows only the main portion of the fast cycle RAM in FIG. 10. In FIG. 21, elements corresponding to ones in FIG. 10 are indicated with the same symbols as ones in FIG. 10. However, FIG. 21 shows the specific portions of the fast cycle RAM according to the invention. Therefore, elements not shown in FIG. 10 are also included therein.

As for the row/column control system in FIG. 21, its description has been described in the "[IV Example of row/column control system" in the "FIRST CHARACTERISTIC". Therefore, its description is omitted herein.

[V] Operation 2

An operation of the row/column control system in FIG. 21 will be described.

FIG. 22 shows an operation waveform of the fast cycle RAM according to the invention.

The third characteristic relates to the first write cycle after the auto-refresh cycle.

Auto-Refresh Cycle Immediately before Write Cycle

In the auto-refresh cycle immediately before the write cycle, when the first command WRA is detected, the control signal bCOLACTWU becomes "L". However, the control signal REFWRT is in the "H" state. Therefore, the row active controller 76 is in a non-operation state, and the control signal BNK is always in the "L" state (Core write inhibition).

When the second command REF is detected, the control signal bREFR becomes "L". However, the control signal REFWRT is in the "H" state, and the control signal BNK is in the "L" state. Therefore, the column active controller 79 is in the non-operation state, and the control signal CSLCK is always in the "L" state. In addition, the CSL controller 81-2 turns the control signal bFCSLE into "H". Accordingly, the DQ buffer (driver) & CSL driver 73 is not activated, so that no column access operation and no operation to transfer the write data to the DQ line is performed.

By the way, when the second command REF is detected, the control signal bREFR becomes "L". Therefore, the write and auto refresh controller 84 (see FIG. 10) causes the control signal REFWRT to be "H", and the auto refresh circuit 85 (see FIG. 10) is activated, and then the circuit 85 turns the control signal REFRI into "H" for a certain period. Then, on receiving the control signal REFRI (="H"), the refresh operation is executed.

During the period of the refresh operation, the REFWRT is in the "H"; the control signal BNK, "L". Therefore, the column active controller 79 is in the state where the controller 79 always outputs the control signal CSLCK (="L") regardless of the control signal bCOLACTW, and the bREFR. Thus, the column access operation is not performed. On the other hand, the control signal BNK is "L", however, the control signal REFRI is in the "H" state. Therefore, during the period when the control signal REFRI is "H", the control signal bWLON becomes "L", thereby the row access operation is executed.

The First Write Cycle after the Auto-Refresh Cycle

In the first write cycle after auto-refresh cycle, when the first command WRA is detected, the control signal bCO-LACTWU becomes "L". However, in this stage, the control signal REFWRT is still in the "H" state. Therefore, the row active controller 76 is in a non-operation state, and the control signal BNK is always in the "L" state (Core write inhibition). This cycle is the write cycle, so that the control signal REFRI is "L". Accordingly, the WL active controller 78-2 turns the control signal bWLON into "H", so that the row decoder 72 is not activated and the row access operation is also not performed.

When the second command LAL is detected, the control signal bCOLACTW becomes "L". However, in this stage, the control signal REFWRT is still in the "H", and the control signal BNK is in the "L". Therefore, the column active controller 79 is in a non-operation state, and the control signal CSLCK is always in "L". Accordingly, since the CSL controller 81-2 turns the control signal bFCSLE into "H", the DQ buffer (driver) & CSL driver 73 are not activated, and the column access operation is also not performed.

By the way, when the second command LAL is detected, the control signal bCOLACTW becomes "L". Therefore, the write & auto refresh controller 84 (see FIG. 10) sets the control signal REFWRT to be "L".

Accordingly, in the second or the later write cycles which will be performed later, the row decoder 72 is activated on receiving the detection of the first command WRA (bCOLACTWU="L"), and the DQ buffer & CSL driver 73 is activated on receiving the detection of the second command LAL (bCOLACTW="L"). Therefore, the row/column access operation and write operation are executed, at the same time, the row/column address signal and load operation of the write data (data & address transfer) are executed.

[VI] Summary

According to the third characteristic, in the first write cycle after the auto-refresh cycle, the row active controller 76 and column active controller 79 are set to the non-operation state with use of the control signal REFWRT (="H"). That is, the data load to the row/column access operation and DQ line is prohibited. However, on receiving the first command WRA, the row address signal is taken into the row address register, and on receiving the second command LAL, the column address signal and write data are taken into the column address register and data register.

In addition, on receiving the second command LAL, the control signal REFWRT is changed to "L". Therefore, in the second or the later write cycles which will be performed later, when the first command WRA is received, then the row/column access operation and a new row address signal are taken. Further, on receiving the second command LAL, the write data are transferred to the DQ line and a new column address signal and new write data are taken into the registers.

Accordingly, in the fast cycle RAM which is applied with the late write system, an operation of switching the auto-refresh cycle to the write cycle can be performed smoothly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a memory core which executes a write operation by using row address data, column address data and write data;

a command detecting circuit which detects first and second write modes in each of successive first and second cycles and a refresh mode, wherein the first cycle includes a loading step loading the row address data, the column address data and the write data into a chip and the second cycle includes a transferring/executing step transferring the row address data, the column address data and the write data to the memory core and executing the write operation; and a controller which controls an operation of the chip, wherein when the second write mode is executed after the first write mode, the second cycle of the first write mode and the first cycle of the second write mode are executed at the same time, and when the refresh mode is executed after the first write mode, the loading step is inhibited in the second cycle of the first write mode, and a refresh operation is executed after the write operation.

2. A semiconductor memory according to claim 1:

wherein the command detecting circuit detects the operation mode based on first and second commands.

3. A semiconductor memory according to claim 2:

wherein the first command selects both of the write operation and the refresh operation, and the second command selects one of the write operation and the refresh operation.

4. A semiconductor memory according to claim 2:

wherein the row address data are loaded into the chip, when the first command selects both of the write operation and the refresh operation.

5. A semiconductor memory according to claim 2:

wherein the column address data and the write data are loaded into the chip, when the second command selects the write operation.

6. A semiconductor memory according to claim 2:

wherein the loading of the column address data and the write data are inhibited, when the second command selects the refresh operation.

7. A semiconductor memory comprising:

a memory core which executes a write operation by using row address data, column address data and write data;

a command detecting circuit which detects an operation mode in each of successive first and second cycles, wherein a write mode is completed by a loading cycle loading the row address data, the column address data and the write data into a chip and a writing cycle transferring the row address data, the column address data and the write data to the memory core and executing the write operation; and a controller which controls an operation of the chip, wherein when the operation mode in the each of successive first and second cycles is a refresh mode, the loading and writing cycles are both inhibited in the second cycle.

8. A semiconductor memory according to claim 7:

wherein the command detecting circuit detects the operation mode based on first and second commands.

9. A semiconductor memory according to claim 8:

wherein the first command selects both of the write operation and the refresh operation, and the second command selects one of the write operation and the refresh operation.

10. A semiconductor memory according to claim 8:

wherein the row address data are loaded into the chip, when the first command selects both of the write operation and the refresh operation.

11. A semiconductor memory according to claim 8:

wherein the column address data and the write data are loaded into the chip, when the second command selects the write operation.

12. A semiconductor memory according to claim 8:

wherein the loading of the column address data and the write data are inhibited, when the second command selects the refresh operation.

13. A semiconductor memory comprising:

a memory core which executes a write operation by using row address data, column address data and write data;

a command detecting circuit which detects first and second write modes in each of successive first and second cycles and refresh mode, wherein the first cycle includes a loading step loading the row address data, the column address data and the write data into a chip and the second cycle includes a transferring/executing step transferring the row address data, the column address data and the write data to the memory core and executing the write operation; and a controller which controls an operation of the chip, wherein when the first write mode is executed before the second write mode, the second cycle of the first write mode and the first cycle of the second write mode are executed at the same time, and when the refresh mode is executed before the second write mode, the transferring/executing step is inhibited in the first cycle of the second write mode.

14. A semiconductor memory according to claim 13:

wherein the command detecting circuit detects the operation mode based on first and second commands.

15. A semiconductor memory according to claim 13:

wherein the first command selects both of the write operation and the refresh operation, and the second command selects one of the write operation and the refresh operation.

16. A semiconductor memory according to claim 13:

wherein the row address data are loaded into the chip, when the first command selects both of the write operation and the refresh operation.

17. A semiconductor memory according to claim 13:

wherein the column address data and the write data are loaded into the chip, when the second command selects the write operation.

18. A semiconductor memory according to claim 13:

wherein the loading of the column address data and the write data are inhibited, when the second command selects the refresh operation.

* * * * *